United States Patent [19]

Donath et al.

[11] Patent Number: 5,365,463

[45] Date of Patent: Nov. 15, 1994

[54] METHOD FOR EVALUATING THE TIMING OF DIGITAL MACHINES WITH STATISTICAL VARIABILITY IN THEIR DELAYS

[75] Inventors: Wilm E. Donath, Pleansantville; Robert B. Hitchcock; Jeffrey P. Soreff, both of Wappingers Falls, all of N.Y.

[73] Assignee: International Business Machines Corporation, Armonk, N.Y.

[21] Appl. No.: 631,827

[22] Filed: Dec. 21, 1990

[51] Int. Cl.$^5$ .............................................. G06F 15/60
[52] U.S. Cl. ..................................... 364/578; 364/488
[58] Field of Search .............. 364/578, 488, 489, 554; 395/500

[56] References Cited

U.S. PATENT DOCUMENTS

| | | | |
|---|---|---|---|
| 4,263,651 | 4/1981 | Donath et al. | 364/488 |
| 4,425,643 | 1/1984 | Chapman et al. | 364/488 |
| 4,554,636 | 11/1985 | Maggi et al. | 364/488 |
| 4,698,760 | 11/1987 | Lembach et al. | 364/491 |
| 4,791,357 | 12/1988 | Hyduke | 364/490 |
| 4,924,430 | 5/1990 | Zasio et al. | 364/488 |
| 5,095,454 | 3/1992 | Huang | 364/578 |

OTHER PUBLICATIONS

SDA; "Timing Analyzer"; 1988.
Park et al.; "Statistical Delay Fault Coverage and Defect 10 vol for Delay Faults"; IEEE International Test Conference 1988.
"Statistical Software Finds Timing Errors and Suggests Fixes"; Electronic Design; Stanley Hyduke; Oct. 1987; pp. 75–75.
"Computer Timing Verifier"; IBM Technical Disclosure Bulletin; Apr. 1981; vol. 23, No. 11; A. L. Frisiani et al.
"System for Timing Verification"; Research Report; IBM Thomas J. Watson Research Center Distribution Services 36–068; RC 8373; (#36454); Jul. 23, 1980; A. L. Frisiani et al.

*Primary Examiner*—Ellis B. Ramirez
*Attorney, Agent, or Firm*—Whitham & Marhoefer

[57] ABSTRACT

An apparatus and method for simulating timing performance of designs of digital machines which allows for the avoidance of lumping of correlation of correlation coefficients which may be significant to the slacks which may occur in a particular design. Delays of particular digital elements are derived by random selections from distributions of delay values based on correlations between different observed or otherwise reasonable distributions of relative delays of digital element pairs including pairs of senses of logic value transitions, pairs of technologies and pairs of packaging levels as an accuracy enhancement. Delay distributions are built up of weighted sums of other distributions and may be asymmetrical. Several computational enhancements disclosed include arrangements allowing reductions in paging (e.g. reduction in number of accesses to secondary memory). Other enhancements include application enhancements by providing generality of methodology and accommodation of large model size, further computational enhancement by providing generality of delay propagation algorithms and diagnostic enhancements by providing cycle time/yield data and allowance of re-simulation of failure modes of design performance by retaining seed values corresponding to simulated machines.

24 Claims, 10 Drawing Sheets

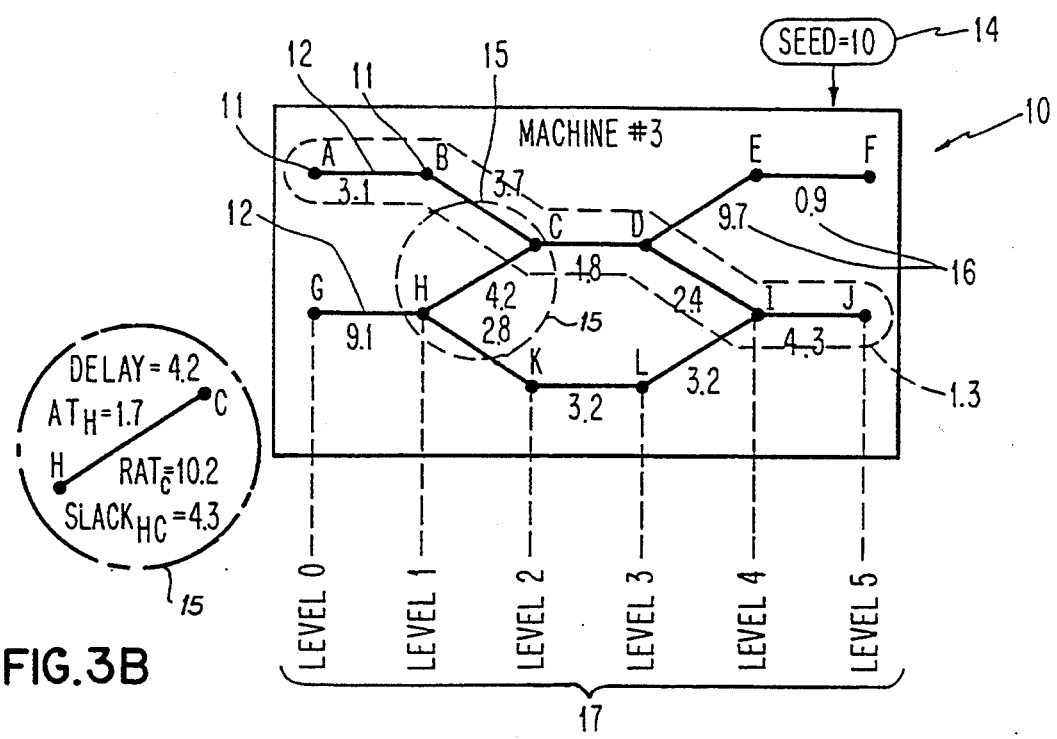
FIG.3B
FIG.3A
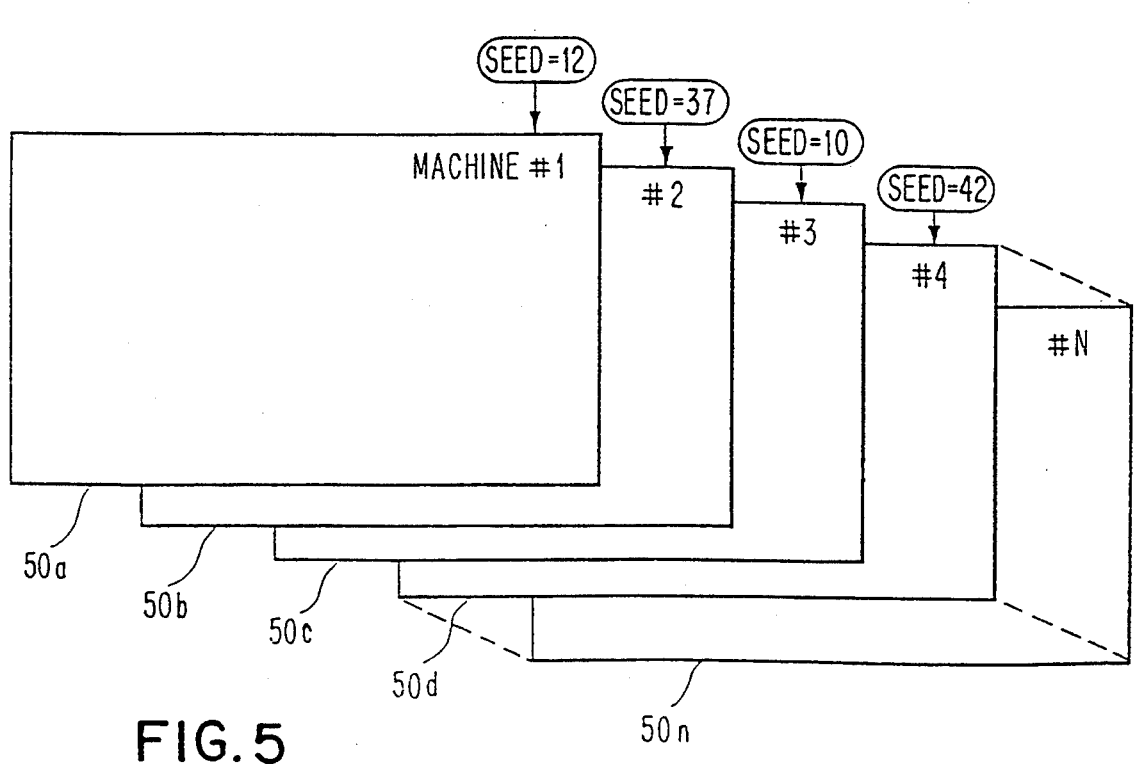
FIG.5

| DELAY$_1$ | DELAY$_2$ | - - - | DELAY$_n$ |
|---|---|---|---|
| AT$_1$ | AT$_2$ | - - - | AT$_n$ |
| RAT$_1$ | RAT$_2$ | - - - | RAT$_n$ |
| SLACK$_1$ | SLACK$_2$ | - - - | SLACK$_n$ |
| SEED$_1$ | SEED$_2$ | - - - | SEED$_n$ |

MACHINE #1, MACHINE #2

FIG. 7b

| | | | | AT STAT. SUMM. |
|---|---|---|---|---|
| | | | | RAT STAT. SUMM. |
| | | | | SLACK STAT. SUMM. |
| DELAY$_1$ | DELAY$_2$ | - - - | DELAY$_m$ | |
| AT$_1$ | AT$_2$ | - - - | AT$_m$ | |
| RAT$_1$ | RAT$_2$ | - - - | RAT$_m$ | |
| SLACK$_1$ | SLACK$_2$ | - - - | SLACK$_m$ | |
| SEED$_1$ | SEED$_2$ | - - - | SEED$_m$ | |

FIG. 12b

SEGMENT H → C

| MACHINE # | DELAY$_{HC}$ | AT$_H$ | RAT$_C$ | SLACK$_{HC}$ | SEED |
|---|---|---|---|---|---|
| 1 | 3.9 | 0.9 | 10.0 | 5.2 | 12 |
| 2 | 7.8 | 1.3 | 15.0 | 5.9 | 37 |
| 3 | 4.2 | 1.7 | 10.2 | 4.3 | 10 |
| 4 | 2.7 | 5.9 | 15.5 | 6.9 | 42 |
| - | - | - | - | - | - |

FIG. 8

| |
|---|
| $\rho_{fr} = \rho_{rf}$ |
| $\rho_{ff}$ |
| $\rho_{rr}$ |
| $\rho_{ww}$ |
| $\rho_{wc}$ |

| | | T$_1$ | | T$_2$ | | | | WIRES ON BOARD | | CHASSIS WIRES | |
|---|---|---|---|---|---|---|---|---|---|---|---|
| | | r | f | r | f | - | - | r | f | r | f |
| T1 | r | $\rho_{rr}$ | $\rho_{rf}$ | $\rho_{rr}$ | $\rho_{rf}$ | | | | | $\rho_{rr}$ | $\rho_{rf}$ |
| | f | $\rho_{fr}$ | $\rho_{ff}$ | $\rho_{fr}$ | $\rho_{ff}$ | | | | | $\rho_{fr}$ | $\rho_{ff}$ |
| T2 | r | $\rho_{rr}$ | $\rho_{rf}$ | $\rho_{rr}$ | | | | | | | |
| | f | $\rho_{fr}$ | $\rho_{ff}$ | $\rho_{fr}$ | | | | | | | |
| WIRES ON BOARD | r | | | | | | | | | | |
| | f | | | | | | | | | | |
| CHASSIS WIRES | r | $\rho_{rr}$ | | | | | | | | | $\rho_{rf}$ |
| | f | $\rho_{fr}$ | $\rho_{ff}$ | | | - | - | | | $\rho_{fr}$ | $\rho_{ff}$ |

METHOD FOR EVALUATING THE TIMING OF DIGITAL MACHINES WITH STATISTICAL VARIABILITY IN THEIR DELAYS

BACKGROUND OF THE INVENTION

1. Field of the Invention

The present invention generally relates to the analysis of timing in electrical circuits and, more particularly, to the analysis of complex digital machines, such as logic circuits, having a statistical variability in propagation delays which they exhibit.

2. Description of the Prior Art

All structures through which a variable electrical signal can be propagated will exhibit a finite propagation time or delay in response to variations in that electrical signal. This propagation delay will typically be different for different kinds of devices and will also vary from device to device among devices which are structurally similar. While propagation delays may be of little significance in some types of electrical circuits, they are often critical to the performance of digital machines such as logic circuits where, typically, many serial stages and many possible signal propagation paths will exist. Therefore, techniques for analyzing propagation delays in digital logic circuits are critical to the design of such circuits.

In analyzing the design of logic circuits, the timing of signals arriving at some elements, such as latches or clocked elements (hereinafter collectively referred to as race-sensitive elements), must be considered as if each possible path of a signal through the circuit were separately considered. If all possible paths through the circuit show the correct sequence of signal arrival times at each element (or if the correct sequence can otherwise be implied), the logic circuit can be considered to be unconditionally operative for a given cycle time. Conversely, the potential shortest cycle time or highest clock rate can be determined by the computation of so-called slack at each element. Slack is basically a timing tolerance which will decrease with decreasing cycle times. When slack becomes negative at any element, the minimum cycle time will have been reduced below the cycle time at which the circuit design is unconditionally operative. As is well-understood, this analysis is important in defining the specifications of manufactured devices, including, but not limited to, chips, boards, assemblies of boards and complete processors, memory systems, computers, networks and the like.

However, since all possible paths through a logic circuit must be, at least inferentially, considered and the slack at the input of each race-sensitive element must be evaluated, an enormous computational burden is presented in the analysis of all but the simplest logic circuits. For this reason, various known techniques for analyzing designs including significant statistical variation and multiple technologies resort to computational simplifications which, while allowing analysis to be performed in a reasonable amount of time, introduce departures from the true performance of the design, when implemented in manufactured devices.

One such type of technique is known as a worst-case static timing analysis in which delays are assigned for each stage and propagation delays are computed for each stage of each path through the circuit. These delays are compared at selected stages therein where the propagated signals may interact, such as at clocked logic elements. Of course, such an analysis technique cannot treat the elements of the logic circuit as ideal or even typical if useful results are to be obtained. Typically, analysis is done on the basis of "worst case" or "maximum-minimum" scenarios. Both of these scenarios assume conditions such as the latest possible signal arrival times and earliest possible clock arrival times and determine the operability of the circuit on the basis of positive or negative slack. Slack will be positive if the signals arrive at a given logic device in the proper order and negative if the signals arrive in an incorrect order to produce the desired response. Because of the assumption of worst case conditions rather than the actual, statistically variable, performance characteristics of each of the devices in the circuit, many signal paths through the circuit will seem to have defects where none, in practice, will be found to exist in a large percentage of the actual circuits, once fabricated.

Other static timing analyses achieve somewhat improved results by providing for inclusion of statistical variation to a greater or lesser extent. However, all previously known forms of these simulations carry an increased computational burden and also require simplifying assumptions to be made.

One such technique incorporating statistical variation is known as Statistical Global Static Timing Analysis. This technique calculates candidate signal arrival times at each node by standard statistical formulas using known element delay variances and user-specified correlation coefficients within a few major categories. The worst (e.g. earliest or latest) of these arrival times is used to compute the performance of the next element or node in each circuit path. For this reason, this technique is constrained to follow each path sequentially, segment-by-segment, through the device. This technique yields reasonably good results under the above constraints but breaks down when different technologies having different correlation coefficients are involved. Due to the computational burden, the technique is usually limited to the use of only five correlation coefficients, as will be discussed below.

Another known technique, referred to as Statistical Path-Oriented Static Timing Analysis uses similar statistical formulas as Statistical Global Static Timing Analysis, described above, and provides for some additional choices of correlation coefficients (e.g. for additional technologies). This technique, however, analyzes each path individually rather than the segment-by-segment analysis provided in Statistical Global Static Timing Analysis. This technique, while producing statistically accurate results in most cases, is impractical in the analysis of current designs because of the computation time involved.

While each of these above types of static timing analysis can produce usable results under some conditions, restrictions on applicability has diminished the effectiveness of such techniques as logic circuits have become increasingly complex and utilized multiple technologies in implementation. Also, as a group, all of the above static timing analysis methods exhibit a trade-off between computation time and accuracy for a given design. Individually, the accuracy of each technique is not adjustable because none provide for simulation with multiple runs to include statistically variable timing conditions. As logic designs have become more complex, techniques which provide more realistic results have required prohibitive amounts of computation time.

Moreover, as aggressiveness in full utilization of logic circuit performance has increased, the most serious drawback of the various static timing analyses, described above, is the fact that each includes simplifying assumptions which preclude the improvement of the degree of accuracy of the particular technique in use.

A technique which provides the ability to predict and improve the degree of accuracy of the timing analysis is described in "Statistical Software Finds Timing Errors and Suggests Fixes" by Stanley Hyduke; Electronic Design; October, 1987; pages 75-77. U.S. Pat. No. 4,791,357, to Hyduke is also apparently related to this process. However, no publication of the process or algorithm employed by Hyduke in this Monte Carlo technique (so called due to its utilization of random number generation) appears to have been published. (It is to be understood that the present invention, since it also relies on random number generation, is also referred to as a Monte Carlo technique and, hereinafter, for purposes of clarity, the known Monte Carlo techniques, including that described in the Hyduke article, will be referred to as prior art Monte Carlo techniques.)

As a practical matter, implementations of the prior art Monte Carlo techniques also requires simplifying assumptions regarding the nature and characterization of the distribution of each element and thus are somewhat subject to the same inaccuracies and departures from accurate characterization of real devices as the static timing analyses, discussed above, posing a similar limitation on applicability of the technique. In fact, to perform the prior art Monte Carlo technique, it has been chosen, in view of programming complexity or other considerations, to assign an equiprobable, rectangular distribution to all elements, as disclosed in the Hyduke article cited above. In such a case, it is not possible to determine the exact percentage of failed nodes in a design, when implemented, but only a relative percentage of failures of each node to allow ranking of the importance of potential failure rates. When absolute failure rates are important, there is no alternative to the expenditure of large amounts of analysis time to find the actual distribution curve which may still depart from reality if simplifying assumptions are made concerning the delay distributions of the individual elements.

The prior art Monte Carlo techniques are also not easily adaptable to multiple technologies or generalization, just as they are not easily applicable to different, non-equiprobable, timing variation distributions. Typically, a random number delay assignment is made for circuits on different substrates, with delay spreads peculiar to each circuit type. Then a second random variation which corresponds to a 30% spread among identical circuits on the same substrate is superimposed on the first random delay assignment. Clearly, this constitutes only the roughest of approximations of the actual distributions which may be encountered.

A trade-off between computation time and accuracy also exists in prior art Monte Carlo techniques. As pointed out above, a fairly large number of samples must be computed to derive a statistically valid distribution of total delay times. Also, for purposes of diagnostics of the portion of the design which will exhibit a significant failure rate, the process must be applied to smaller sub-path portions of each path, increasing the computational burden. While the increased computational burden may be of minor consequence in some cases, it should be noted that a substantial amount of computational time is spent looking for unlikely events and, in practice, the range of possible variation in timing is often artificially reduced to find only a large percentage of faulty nodes during design. A further analysis is then required to find the remainder of faulty nodes once the design has been refined.

In summary, while the prior art Monte Carlo techniques potentially offer determinability of the degree of accuracy which they provide, the applicability, accuracy, computational complexity, and possibility of providing diagnostics and information useful in establishing specifications only provide improvement over static timing techniques at the cost of great expenditure of processing time. Therefore, a need is evident for application, accuracy, computation and reporting enhancements for statistical timing analysis to allow the potential of such statistical analysis techniques to be realized.

SUMMARY OF THE INVENTION

It is therefore an object of the present invention to provide a data structure which will facilitate the use of a large plurality of correlation coefficients corresponding to known distributions in the performance of digital machines.

It is another object of the invention to provide an accuracy enhancement fora timing analysis technique which includes the use of different probability distributions for selecting data for use in timing analysis simulations.

It is a further object of the invention to provide a diagnostic enhancement for a timing analysis technique including a means for reporting a list of delay values which result in a failure of a particular simulated machine.

It is yet another object of the invention to provide a reporting enhancement for a timing analysis technique which includes computation of an overall slack probability distribution as an projection of cycle time versus yield.

It is a yet further object of the invention to provide a computation and data storage enhancement for a timing analysis technique which allows the use of vector processing, increased computational speed, and accommodation of large model sizes.

It is another further object of the invention to provide an accuracy enhancement for a timing analysis technique which can accommodate real and anticipated asymmetrical production distributions during analysis.

In order to achieve the above and other objects and advantages, a Monte Carlo type digital machine simulation apparatus including a data structure including a matrix of correlation factors including all combinations of pairs of conditions of at least one selected independent cause of delay variation.

In accordance with another aspect of the invention, a Monte Carlo type digital machine simulation apparatus is provided including means for representing at least two differently shaped delay distributions with respective ones of correlation factors.

In accordance with a further aspect of the invention, a Monte Carlo type digital machine simulation method is provided including the step of deriving at least two delay distributions from respective ones of said correlation factors.

In accordance with yet another aspect of the invention, a Monte Carlo type digital machine simulation apparatus is provided including means for storing a seed value corresponding to each of a plurality of simulated digital machines, and means for outputting at least said seed value corresponding to any simulated digital machine having a slack of less than a predetermined value.

In accordance with a yet further aspect of the invention, a Monte Carlo type digital machine simulation method is provided including simulating a plurality of digital machines constituting a subset of said digital machines to derive a predetermined number of results of said simulation of said plurality of digital machines, summarizing the results of said simulation of said plurality of digital machines and simulating a further plurality of constituting a further subset of said digital machines, said plurality of results of said simulation of said plurality of digital machines numbering fewer than a predetermined number.

BRIEF DESCRIPTION OF THE DRAWINGS

The foregoing and other objects, aspects and advantages will be better understood from the following detailed description of a preferred embodiment of the invention with reference to the drawings, in which:

FIG. 9 illustrates a data structure for holding correlation coefficients as would be used in the prior art, FIG. 10 shows a correlation coefficient matrix in accordance with the present invention, FIG. 12b illustrates a data structure formed by the operation of the invention in accordance with FIG. 12a.

P DETAILED DESCRIPTION OF A PREFERRED EMBODIMENT OF THE INVENTION

Figure 1A:
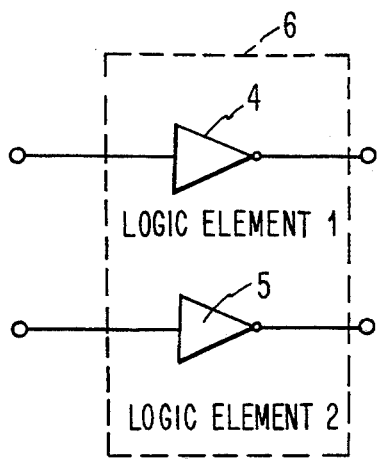
FIG. 1a is a representation of two arbitrary logic devices between which some correlation of delay variation may exist.
Figure 1B:
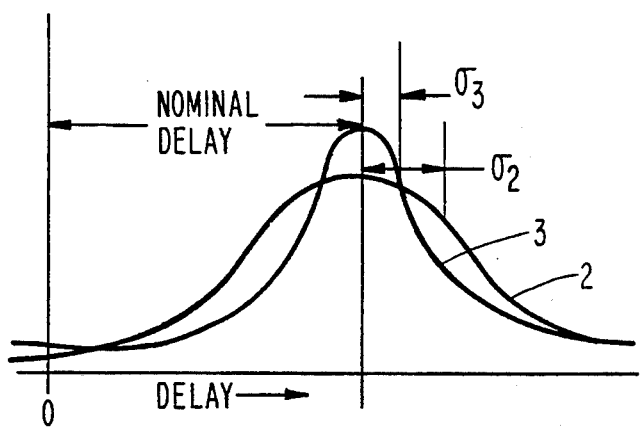
FIG. 1b shows two possible delay distributions between the arbitrary logic devices of FIG. 1a, FIGS. 2a, 2b, 2c, 2d and 2e show graphical depictions of pairs of delays of the logic devices of FIG. 1a, FIG. 3 illustrates a model of a simulated machine.

Referring now to the drawings, and more particularly to FIGS. 1a and 1b, there is shown, in FIG. 1a, an arbitrary pair of logic devices 4, 5 representing any two possible digital element structures through which a digital signal may be propagated, including wires, cables, gates, latches and the like. Each of these devices will have a delay in the propagation time of the digital signal therethrough which may be more or less variable from a nominal value, depending on the structure of the device, and more or less correlated to the delay of the other device, depending on two independent causes of variation such as the technologies of the two devices and the level of packaging (e.g. proximity) they share. For instance, all devices on the same CMOS chip will be very well correlated but will be correlated to a lesser degree from chip to chip and even less correlated for different chips from different production runs. Other correlations will apply for different technologies and electrical structures (e.g. NMOS, PMOS, chip wires, board wires, chassis wires, etc.). Therefore, correlations must be considered for all of like technologies on the same chip, like technologies on different chips or electrical structures (e.g. inclusive of wiring types such as those noted above), different technologies on the same chip and different technologies on different chips of electrical structures. The correlation may also vary with the respective senses of the signals passed therethrough, such as if both signals are rising, both falling or of opposite senses; specifically, device 4 rising with device 5 falling and device 4 falling with device 5 rising. The relationship between the technologies is schematically represented by dotted line 6.

The distribution of random variation from a nominal value of propagation delay for either of devices 4, 5 is depicted in FIG. 1b. It should be understood that devices 4, 5 can be located between any two nodes of the digital machine and can be characterized by the technology used therein. It should also be understood that the nominal rise or fall time of the devices is distinct from the nominal delay. For example, while a short length of a connection on a chip may have rise times and propagation delays which are fairly comparable, in a coaxial cable, the rise time may be extremely short while the propagation delay for even a fairly short length of such cable will be many times longer. Therefore, it is to be understood that correlations referred to hereinafter are correlations between delays. The random variation of these delays from a nominal value will depend upon the technology used in the logic devices and may be fairly broad as shown by distribution curve 2 in FIG. 1b or fairly narrow as shown by distribution curve 3. The actual shapes of these distribution curves will depend on the nature of the devices and are depicted here as Gaussian distributions. Of course, the left end of the curve to the left of the vertical axis represents a negative delay and thereby violates causality. Alteration of the distribution curves to accurately reflect reality is accommodated by the invention as will be explained in further detail below. The measurement of such delays and the statistical description of variations therein is well understood and need not be elaborated upon.

Figure 2A:
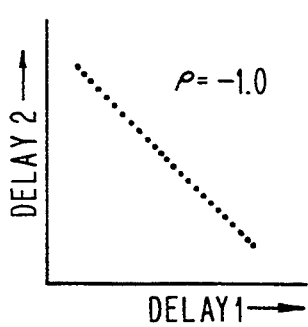
Figure 2B:
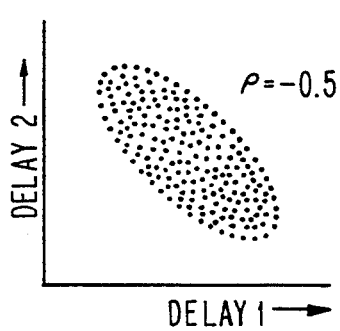
Figure 2C:
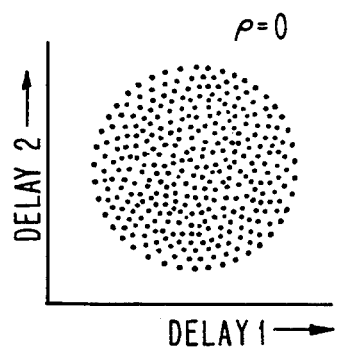
Figure 2D:
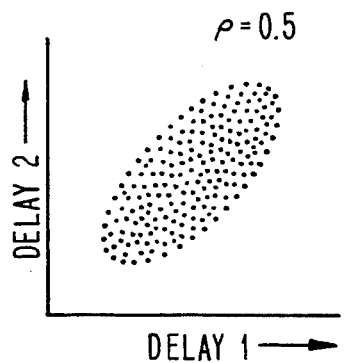
Figure 2E:
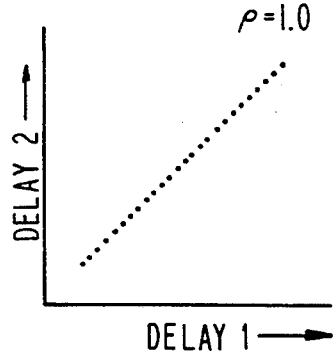

The delays and statistical variations in the delays of devices 4, 5 will be correlated to a greater or lesser extent depending on the respective technologies used therein and the senses of the signals propagated through each of the devices. The correlation factor for any two arbitrary devices is a measure of how well the delay of one device may be predicted by the performance of the other device of any arbitrary pair of devices. Several exemplary degrees of correlation are depicted in FIGS. 2a-2e. If measured pairs of propagation delays bear no relationship to each other, a graph of pairs of measured values would have the appearance of FIG. 2c, with pairs of measurements each being represented by a dot with the dots extending over an area of the plot depicted, for example, as generally circular (which would result from Gaussian distributions) at fairly equal density. The correlation factor, $\rho$, will then be 0.0 to indicate the total absence of correlation between the delays. If one delay tends to be less with increases of the other delay, for whatever reason, some correlation will be evident in the distribution of the plot of delay value pairs, as illustrated in FIGS. 2a and 2b. Such a condition might be caused by inverse dependence of device delays on power supply variation. These correlations are reflected by correlation coefficients which are negative. In FIG. 2a, particularly, the variation in delay 2 is completely predictable in terms of delay 1 and the correlation coefficient is equal to $-1.0$. Conversely, if delays in one of devices 4, 5 generally tend to follow variations in the delay of the other, as illustrated in FIGS. 2d and 2e, the distribution of the plots of delay value pairs will also show some correlation which can be expressed by a positive correlation coefficient. Complete predictability, as might be approached by a simple CMOS gate array on a single chip, is illustrated in FIG. 2e, corresponding to a correlation factor of 1.0.

The basic point of correlation factors, as used in the invention, is that a value for one delay will generally imply at least some distribution for another delay and performance values randomly selected according to that distribution can be expected to accurately reflect real world measurements to the extent that such correlation factors are derived from such real world measurements. Therefore, if all such correlation factors can be accounted for, as is done in the present invention, validity of the simulation can be assured to an increased degree of confidence.

In simulation of variation of the performance of real devices, it is a well-known technique, characteristic of so-called Monte Carlo techniques, to use a random number generator to produce a random value which is then used to pick an arbitrary performance value according to a reasonable or observed distribution of performance values. Random number generators, themselves, are well-known, particularly the type which generates a sequence of numbers having the property of statistical randomness from a selected seed value. However, it is also a property of such random number generators that the same sequence of numbers will always be generated from the same seed value and this type of random number generator is significant to the apparatus and method of the present invention.

The prior art Monte Carlo technique, described briefly above, also uses a random number generator to pick performance values according to a distribution, such as equiprobable (rectangular) distributions. However, realistic statistical distributions of variations in delay values encountered in actual performance measurements evidently cannot be easily accommodated since equiprobable, rectangular distributions are commonly used. Therefore, the actual technique of obtaining a particular candidate performance value through the use of a random number generator and a statistical distribution need not be further discussed.

Both the prior art Monte Carlo technique and the present invention require some sort of modelling of the digital machine to be simulated. In the present invention, the modelling used can be schematically depicted as shown in FIG. 3. It is to be understood that the modelling shown is for purposes of illustration only, and while certain aspects of the prior art Monte Carlo technique can be explained with reference to FIG. 3 in the course of describing the present invention, no inference is to be drawn that FIG. 3 is prior art as to the present invention.

Both the prior art Monte Carlo technique and the present invention ultimately simulate performance of a logic design by construction of a plurality of machines or samples. These simulated machines will differ from each other by statistical variations in performance both in an overall sense and on a segment level within a path in the digital machine. One such machine 10, arbitrarily designated as machine #3, is shown. Such a machine will have a plurality of nodes 11 connected by segments 12 forming a plurality of paths 13 through the circuit. While path 13 is depicted as containing nodes ABCDIJ including segments AB, BC, CD, DI and IJ, such paths could also be formed including nodes ABCDEF, GHCDIJ, GHKLIJ, etc. For purposes of visualizing the invention, node A could be a data signal input and node G could represent a clock input or vice-versa. Nodes B and H might then represent clock and data inputs to a race-sensitive element, such as a clocked element or latch, but might even more critically be inputs to a gate which would only provide a correct response during a time window when correct signals were simultaneously present at its inputs. Propagation delays which are of interest will occur only in segments 12 such as AB, BC, HC, etc. Therefore, the simulated machine comprises a network of delays occurring in the segments 12.

A typical segment HC is illustrated in a circular excerpt corresponding to chain line 15 with legends indicating critical values thereof. The segment will have a statistically assigned delay corresponding to machine #3 although this particular value could appear for this segment in another simulated machine. An arrival time $AT_H$ of a signal at node H, the input to this segment, will exist depending on the delay present in segment GH. A required arrival time $RAT_C$ will also exist as a property of the segment due to the requirements of the following segment, denoted here by the subscript, and can be computed from the delay of the segment. Specifically, the required arrival time, RAT, is the time at which a signal must arrive at an input to the segment in order to enable the segment to produce an output (input to the following segment) which will allow the following segment to function correctly. The slack, or timing tolerance, for the segment can then be computed from the difference between the required arrival time $RAT_C$ and the accumulated delay, $AT_C$ at the output of the segment which is equal to the sum of the arrival time, $AT_H$, at the input of the segment and the delay, $D_{HC}$, of the segment according to the equation $$Slack_{HC} = RAT_C - (AT_H + D_{HC}).$$

While this equation and the above discussion has used alphabetic subscripts to emphasize the relationships of the parameters of interest for each segment, it may be helpful to consider all of the parameters to express properties of each particular segment and to note that, for the i-th segment, the computation of arrival times $AT_i$ requires computation by propagation of delays forward through the simulated machine and computation of required arrival times, $RAT_i$, and slack, $Slack_i$, requires propagation of delays and arrival times, respectively, backward through the simulated machine as a matter of having the required data available at the time the computation is to be performed. Therefore, the equation for computing slack may be generalized as $$Slack_i = RAT_i - AT_i.$$

Accordingly, the latter notation will be used in further description of the invention and its operation, below.

With the above as background for an understanding of the invention, a simple process, deemed to be within the scope of the invention, to derive the results similar to those described by Hyduke will be described below with reference to FIGS. 4a and 4b. In the methodology shown in FIG. 4a, delay variation for each element is characterized as a continuous distribution having a mean value and a standard deviation. A path or sub-path is then analyzed numerous times with delay values randomly selected according to the continuous distribution specified for each element of each path. Each iteration of this calculation is treated as a sample and the total delay of the path or sub-path will also form a distribution of total delay times. As the number of samples is increased, the certainty of the distribution of total delay times will increase and the degree of statistical accuracy of the analysis can be determined. Essentially, this means that the possible error in the prediction of the number of fabricated logic circuits which will be operable at a given cycle time will be reduced with an increasing number of iterations of the computation of total delay time.

Figures 4A, 4B:
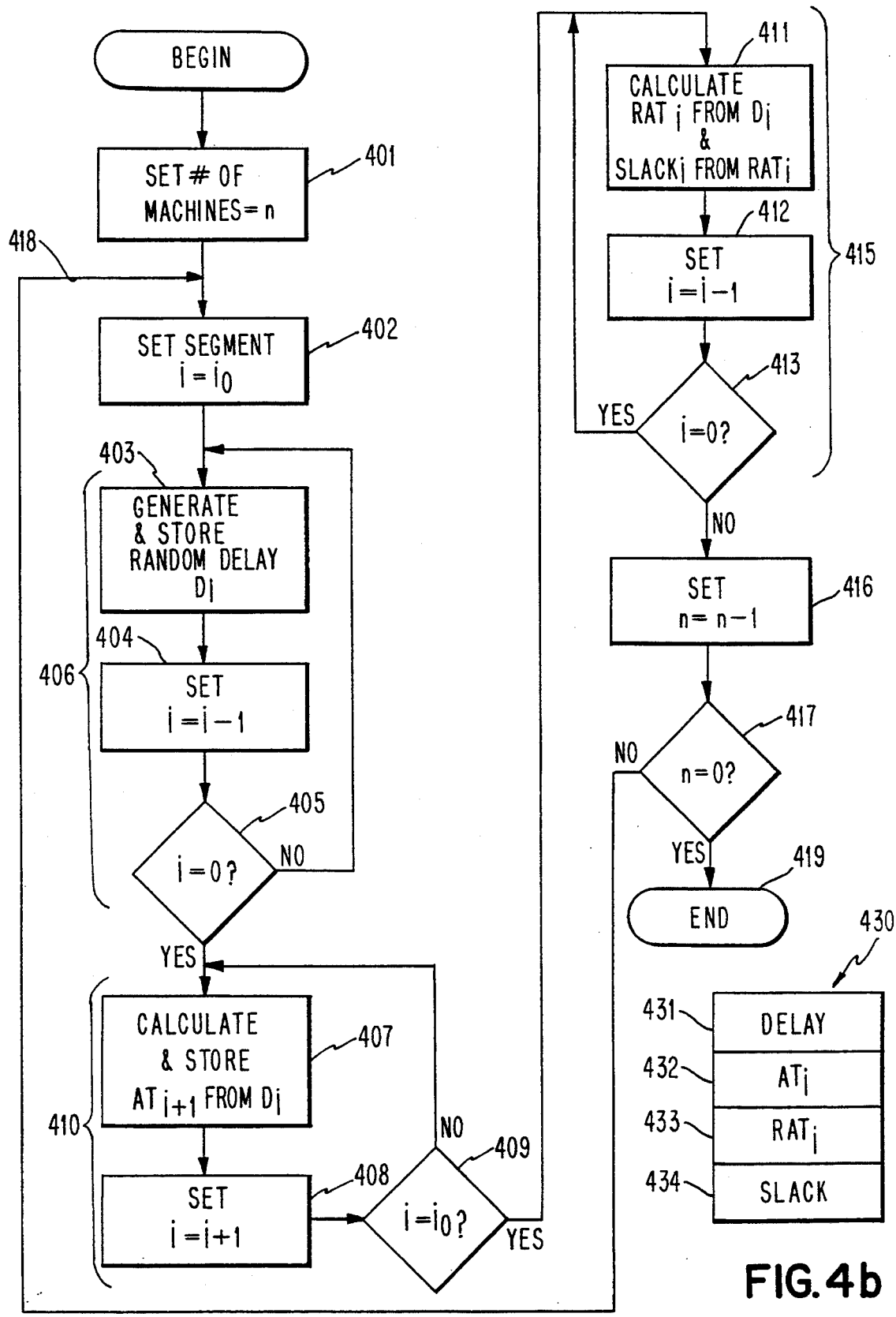
FIGS. 4a and 4b illustrate one implementation of a Monte Carlo technique according to the invention, FIG. 5 schematically illustrates a plurality of simulated machines in accordance with FIG. 3 resulting from different seed values, FIG. 6 schematically illustrates mapping of delays to slacks in a simulated machine according to FIG. 3.

FIG. 4a shows a simplified flow chart corresponding to an implementation of a Monte Carlo technique in accordance with the invention. As noted above, any Monte Carlo technique derives its capacity for being of determinable and alterable accuracy by providing for the generation of a user-selectable plurality of simulated machines which will vary from each other in a potentially valid statistical manner. Therefore, Monte Carlo techniques, including the technique shown in FIG. 4a provide for definition of the number, n, of simulated machines to be generated at 401. Then, by either user selection or automated design analysis, the maximum number of segments in any path of the design is set at 402. Next, a full set of delays, $D_i$ is generated under control of a random number generator in loop 406 in which a delay for a segment is generated and stored 403, i is decremented 404 and loop exit conditions are tested 405. It should be noted, in this regard that the order of generation of delays is irrelevant to this implementation of the Monte Carlo technique since these delays would effectively exist as initial conditions in any design or simulated machine according to that design. Therefore, delay generation is shown with decrementing of i for simplicity. However, any other order would be equally effective.

Following generation of all delay values for the design, this particular Monte Carlo technique then generates all values of $AT_j$ for each j-th segment by forward propagation of delays, $D_i$, as an accumulation of maxima and sums of delays $D_i$ for values of i from 0 to j in loop 410 including setting $AT_1$ at 0 and adding $AT_i$ and $D_i$ to provide $AT_{i+1}$ at 407, incrementing i (for forward propagation) 408 and testing for loop exit conditions 409. Thus, the design is repeatedly traversed in forward and backward directions to accumulate the $AT_i$, $RAT_i$ and $Slack_j$ values.

It should also be noted that the particular form of the loop 410 is characteristic of the push-forward computation order algorithm, with regard to this particular implementation of the invention. The push-forward algorithm will be explained in greater detail below with regard to another embodiment of the invention shown in FIGS. 7a and 7c. Another form of loop could be substituted embodying the levelizing algorithm or other suitable algorithm, as well.

It should be further noted that calculation 407 preferably includes a loop or other subroutine (not shown) which looks at all arrival times at the input node of the segment and chooses the worst case (early or late) arrival time for the calculation of $AT_{i+1}$. Following the arrival time loop 410, another loop 415 is performed to calculate the required arrival times, $RAT_i$, from delay $D_i$ and slack, $Slack_i$ from $RAT_i$ at 411, including decrementing of i for backwards propagation through the simulated machine 412 and testing for loop exit conditions 413.

When a simulated machine has been completed, the machine number is changed (e.g. decremented) at 416 and loop exit conditions are tested, looping back over path 418 to 402 to generate another machine until the designated number of machines, 50a, 50b, 50c, 50d, . . . , 50n have been generated as schematically illustrated in FIG. 5. In this way, a data structure 430 as shown in FIG. 4b is built up by repeatedly traversing through machine paths in forward and backward directions to characterize each segment of each simulated machine by a delay 431, an arrival time $AT_i$ 432, a required arrival time $RAT_i$ 433 and a slack $Slack_i$ 434 which are respectively accumulated during traversal of simulated machine paths, as described above. This data can then be analyzed, segment by segment, to determine a need for design revision, if the simplifying assumptions regarding the distributions of assigned delays are adequately valid. If not, even a ranking of the percentage failures based on this or the prior art Monte Carlo technique may not be valid, as in the prior art Monte Carlo techniques. It is important to note, in this regard, that the delays, once assigned, are fixed and variations in $AT_i$ and $RAT_i$ due to different technologies in the simulated machine are not accounted for except for a single on-chip/off-chip correlation factor. Also, while the apparent degree of accuracy of this or the prior art Monte Carlo technique may be increased to any arbitrary degree, assuming enough simulated machines can be generated and the degree of accuracy can be theoretically predicted, in practice, the degree of accuracy may be wholly illusory due to the simplifying assumptions unless severe application constraints are imposed. Therefore, while the methodology of FIG. 4a is effective to evaluate designs and can incorporate some computational enhancements to reduce the requirements for some simplifying assumptions, the computational burden is not optimally reduced to allow the efficient generalization of the methodology to extremely complex machines using a plurality of technologies.

Figure 7A:
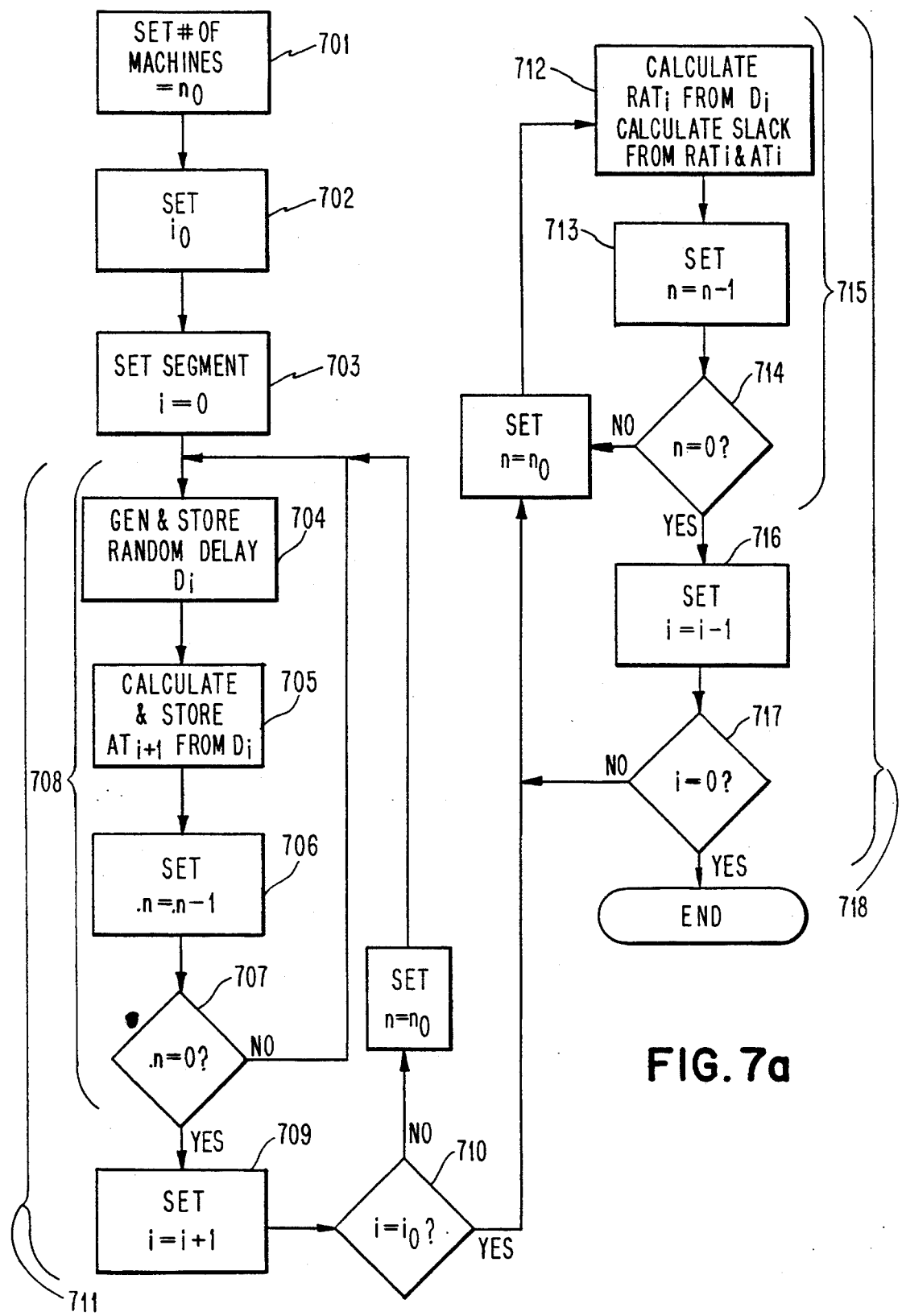
FIG. 7a is a simplified flow chart showing the operation of certain computational and accuracy enhancements according to the present invention.
Figure 7C:
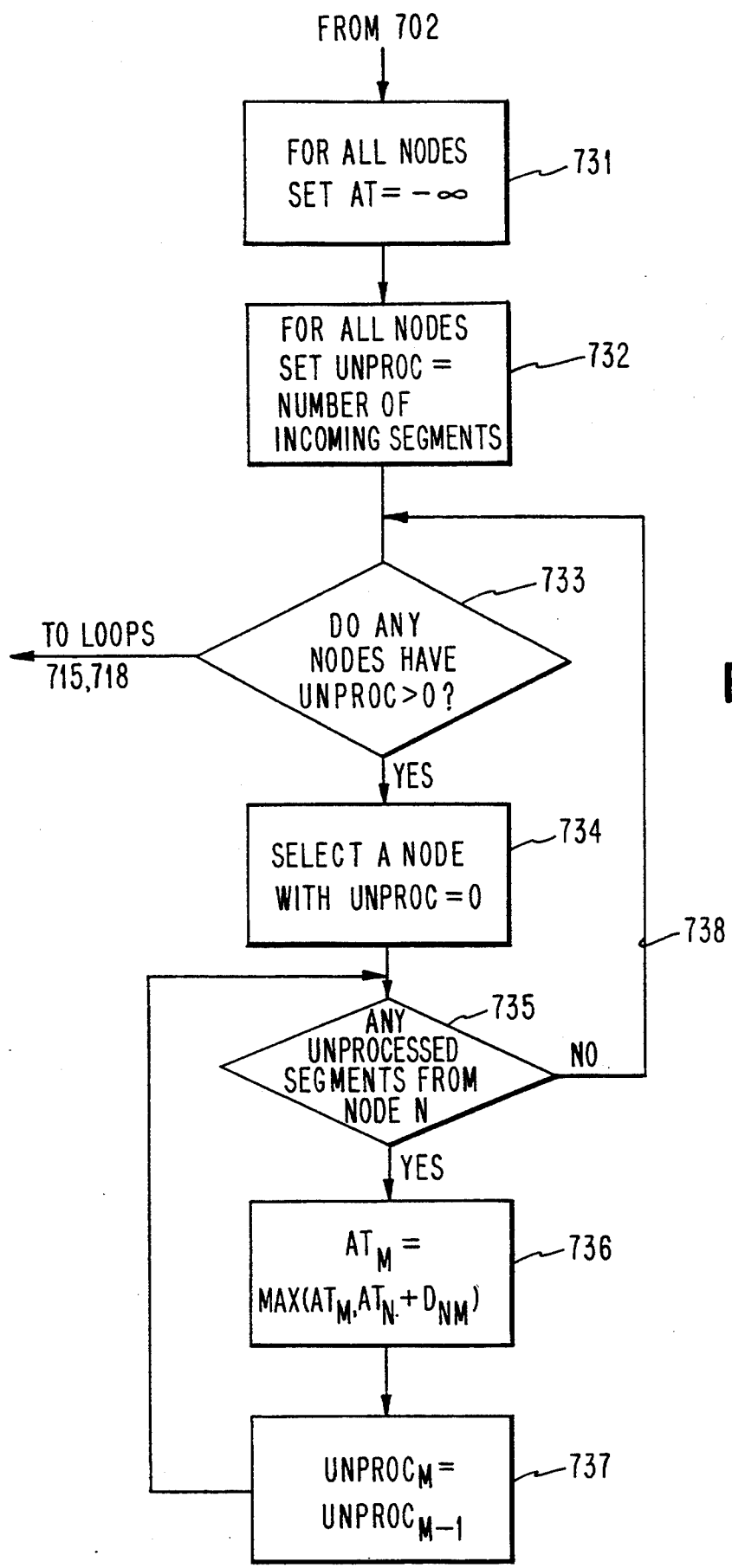
FIG. 7b illustrates the data structure developed by the operation of the invention in accordance with FIG. 7a, FIG. 7c shows a detailed portion of the flow chart of FIG. 7a, implementing a push-forward algorithm, FIG. 8 further illustrates the data developed by the invention for a segment of each of a plurality of simulated machines.

In contrast, a methodology allowing increased generalization of Monte Carlo simulation according to one aspect of the invention is generally illustrated in simplified flow chart form in FIG. 7a. The number of machines to be simulated and the number of segments of the design are set at 701 and 702, respectively. Then the segment number of the design is set at 703. Operation 704 corresponds to 403 of FIG. 4a and generates a delay $D_i$ for the segment. Since $D_i$ is now available, $AT_i$ can now be calculated. However, in contrast to the prior art Monte Carlo technique, $AT_i$, corresponding to $D_i$ and $AT_{i+1}$ are adjusted by distributions corresponding to correlation coefficients accounting for random variation when plural technologies are involved and for relative senses of signal transitions. This additional computation process is facilitated by a data structure in the form of a correlation coefficient matrix also forming a part of the present invention, as will be described in greater detail below.

It should be understood that for simplicity of illustration, element 704 is shown within loops 708 and 711. This will cause the delays to be generated as needed as each segment is simulated for all machines. In practice, it is deemed preferable, however, for this function to be embedded within a separate loop to generate a segment for all machines and further embedded within another separate loop for generation of all segments so that all delays for all segments of all machines are available prior to that portion of the process in which machine simulation is performed. Separating the delay computation from the machine simulation also allows increased flexibility in the utilization of various algorithms such as the levelizing algorithm and the push-forward algorithm, described below, as well as other possible computational enhancements.

The time for performing the additional computation process to account for multiple technologies and signal transition senses is largely the result of the next step 706 and step 713. As pointed out above, the equation for computing slack may be generalized as $$Slack_i = RAT_i - AT_i.$$

and that no other constraint on the computation order exists other than the data for the computation must be available when the computation is performed and the invention may therefore be implemented with any of a variety of computation order algorithms, such as so-called levelizing and push-forward algorithms, such as the levelizing algorithm disclosed in U.S. Pat. No. 4,263,651, hereby incorporated by reference, to Wilm E. Donath et al., filed May 21, 1979 and assigned to the assignee of the present invention.

As an aside, since the computational order algorithm is not important to the practice of the invention except as a performance enhancement thereof, FIG. 3 depicts a plurality of levels 17 in the simulated machine model. The levelizing algorithm requires that all segments connecting with a path through the simulated machine at a given level be computed before proceeding to the next level. The push-forward algorithm allows computation of the AT during forward propagation at any time subsequent to the time that the necessary data becomes available for any path to be computed. RAT and Slack are similarly computed during backward propagation. In other words, the push-forward algorithm checks data availability dynamically while the levelizing algorithm seeks to precompute where data may be needed for computation. It follows that flexibility in choice among these two algorithms and other suitable algorithms is important to the generalization of applicability of the present invention under a wide variety of application circumstances.

Accordingly, instead of incrementing the segment number variable to propagate the delays through the path, the machine number variable, n, is incremented. This results in generating $D_i$, and $AT_{i+1}$ in step 705 (as well as $AT_i$, if i=1) for each machine based on only one memory access to obtain the seed for the random number generator corresponding to each machine for which the $D_i$ and $AT_{i+1}$ is calculated, another memory access to obtain a correlation coefficient from the correlation coefficient matrix and one or two memory accesses to store the result. The data structure, according to the invention, corresponding to this procedure, is shown in FIG. 7b. A seed is carried in the first plane corresponding to each machine and is omitted in other planes. The data is conceptually maintained in planes each corresponding to a segment. The portion of the data structure for one segment or one node corresponding to even a substantial plurality of machines is small enough to fit in dynamic memory of even fairly modest computers, limiting the number of required accesses to secondary memory (e.g. disk) and greatly expediting the computation process. The data which would be carried in dynamic memory at any given time would be of the form shown in FIG. 8. Only after the $AT_{i+1}$ has been computed for all machines by loop 708 is the loop exited 707, i incremented 709 and loop exit conditions tested 710 to proceed to the next segment, resetting the machine number n to $n_0$ each time loop 711 is executed.

When $D_i$ and $AT_i$ have been generated for all segments of all simulated machines, the process continues with computation 712 of $RAT_i$ and $Slack_i$ for each segment of each machine on a similar machine by machine basis 713, 714, through loop 715. The calculations of $RAT_i$ and $Slack_i$ will also include random variation based on delays consistent with the correlation coefficients. Note also that i is decremented at 716 to provide backwards propagation in loop 718, testing loop exit conditions at 717. It should be noted, in this regard, that while parameters are propagated forward and backward, in this embodiment of the invention, the push-forward algorithm does not result in the design being repeatedly traversed as in the methodology of FIG. 4a.

For simplicity of illustration and clarity of description of the basic concepts of the invention, the organization of the various operations are shown in a generic form in FIG. 7a. The organization of operations as well as the specific operations actually performed assume a slightly different form in dependence on the algorithm or computational enhancement used. For example, the operations corresponding to loop 711, including loop 708, of FIG. 7a are shown in detail in FIG. 7c as they would be performed if a push-forward algorithm was employed.

Since a maximum value of the arrival times will be used in the simulation, an easily replaceable dummy value is set as the value of variable $AT_M$ as shown at 731. The value of the variable UNPROC is also set 732 for each node to equal the number of incoming segments to that node. This variable will be used to follow the number of unprocessed incoming segments for that node. Exit conditions are tested at 733 since the process will be complete if no node has any unprocessed incoming segments, If an unprocessed segment is found to exist, a prior node in the path is selected 734 which has no unprocessed incoming segments. Then, if, at 735, there are unprocessed segments leaving that node, say, node N, $AT_M$ is set at 736 to the greater of $AT_M$ or the sum of $AT_N$ and the delay, $D_{NM}$, of that previously unprocessed segment. The $UNPROC_M$ variable is decremented to indicate the processing of an incoming segment for node M at 737 and the process loops to 735 until there are no more unprocessed nodes from node N. Then the process will loop to 733 to proceed to another node. As will be understood by those skilled in the art, a similar process would be used for loop 718, including loop 715, of FIG. 7a for computation of the RAT and slack for each segment of each machine when employing the push-forward algorithm.

As indicated above, the push-forward algorithm operates to compute any segment for which sufficient information has previously been computed. Therefore, the sequence does not necessarily follow levels or an orderly sequence of nodes or segments. However, in the notation used in FIG. 7c, node M follows node N and, in this sense, $AT_M$ generally corresponds to $AT_{i+1}$ in FIG. 7a.

It is especially important to an understanding of the invention that the design is traversed only once in each direction to generate all parameters of all segments of all simulated machines. This not only reduces memory accesses and particularly secondary memory accesses but also allows for implementation with parallel processing, such as by vector processing, further reducing computation time for a given number of samples or simulated machines. This benefit will accrue and allow greater simulation accuracy and confidence in shorter time as long as the process of assigning a random variation on the basis of a statistical distribution identified by a correlation coefficient can be done in less time than an access from secondary memory.

As an indication of the relative speeds with which these operations can be accomplished, at the present time, implementations of the invention and the Monte Carlo technique shown in FIG. 4a, run on equivalent computers, yield processing times for the invention which are 100 times faster than the prior art Monte Carlo technique while allowing all correlations to be observed and requiring fewer simplifying assumptions which would reduce the accuracy of the simulation. Specifically, there is no theoretical need for approximating any particular correlation coefficient with any lumped correlation coefficient and the number of correlation coefficients which can be accommodated can become large enough to support very realistic simulation without significantly slowing the computation process. By the same token, the number of correlations which can be considered may be arbitrarily increased without significantly increasing processing time during the simulation phase of the process using the correlation coefficient matrix data structure which will now be described. Any limitations on the number of sources of delay variation would occur only in the processing time involved in developing transformation matrices from the matrices of correlation coefficients to be used in the simulation and which need not be replicated regardless of the number of simulations performed for a given design.

As background, the Statistical Global Static Timing Analysis technique, noted above, used only five correlation factors. The correlation factors are shown in FIG. 9. A few more were provided in the Statistical Path-oriented Static Timing Analysis. Specifically, $\rho_{fr}=\rho_{rf}$ represent a single correlation coefficient when the senses of signal transitions are different, $\rho_{rr}$ and $\rho_{ff}$ are correlation coefficients where the senses of transitions are the same. Coefficients $\rho_{ww}$ ("wire-wire") and $\rho_{wc}$ ("wire-chip") are lumped, simplified approximations of coefficients indicating off-chip elements and elements going from one technology to a single other technology for rising and falling transitions. Thus it is seen that signal transition correlations and plural technology correlations, to the minor or simplified extent to which they are considered at all in the prior art, are accessed in the same way.

In contrast, as shown in FIG. 10, the present invention provides a data structure which allows a correlation coefficient to be considered in the simulation which reflects a reasonable or observed value for virtually all significant sources of delay variation without a significant increase in computation time. Specifically, in the preferred embodiment of the invention, there is no lumping together, as a simplifying approximation, of the delay variations with the senses of signal transitions, on-chip/off-chip structures or between any given pair of technologies which may be employed in the design.

It should also be noted that, as illustrated, correlation coefficients involving a common technology and common transition sense lie along a diagonal of the matrix from the upper left to lower right thereof. Further, the technologies include not only different chip technologies but also different types of connections such as on-chip wires, module wires, board wires chassis wires, cables, connectors, etc. and include all permutations of pairs of conditions of selected independent causes of delay variation. In practice, matrices of these values are reasonably symmetrical and the invention could also be implemented by providing for all combinations of pairs of such conditions. Accordingly, the term "combinations" will hereinafter be used in a sense inclusive of both permutations and combinations of pairs of such conditions.

Also, in the preferred embodiment of the invention, as presently implemented, a pair of matrices is used; one for on-chip correlation coefficients and the other for off-chip correlation coefficients. It is also contemplated, within the scope of the invention that an even greater plurality of matrices, potentially also accessible in matrix fashion, and plural levels of matrices could be employed to accommodate other potential sources of delay variation.

While only two levels of correlation coefficient hierarchy and two matrices are used in the preferred embodiment of the invention at the present time, this hierarchy can clearly be extended to three, four or more levels should it be found that other categories of correlation coefficients are useful or significant in digital machine simulations. For instance, if such correlation factors are found to be significant, correlation coefficients can be included which account for variation between different types of logic elements within a single technology or within a single element such as address dependent delay variations in large memory chip accesses.

Figure 11C:
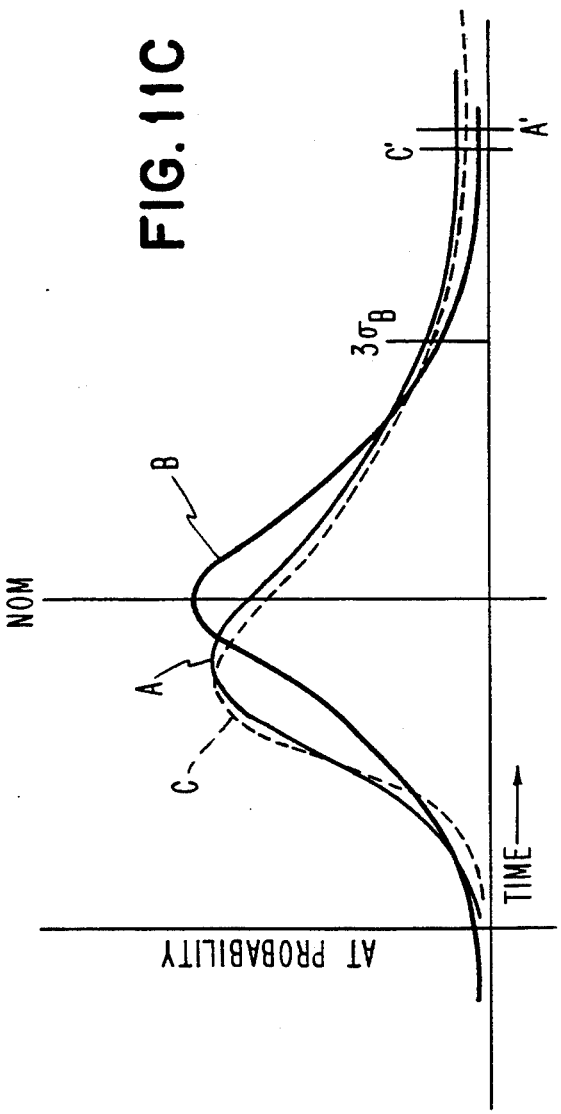
FIG. 11c illustrates an improvement in delay distribution modelling provided by the invention.
Figure 11A:
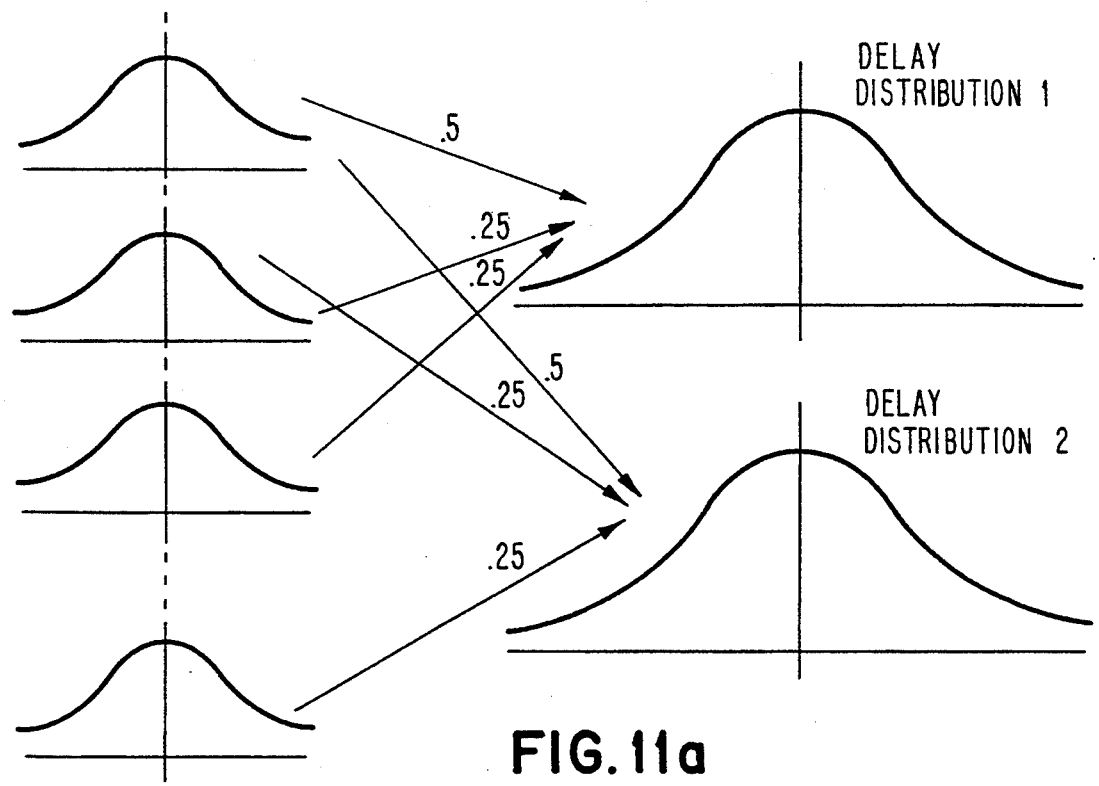
FIGS. 11a and 11b illustrate the construction of arbitrary delay distributions according to the invention.
Figure 11B:
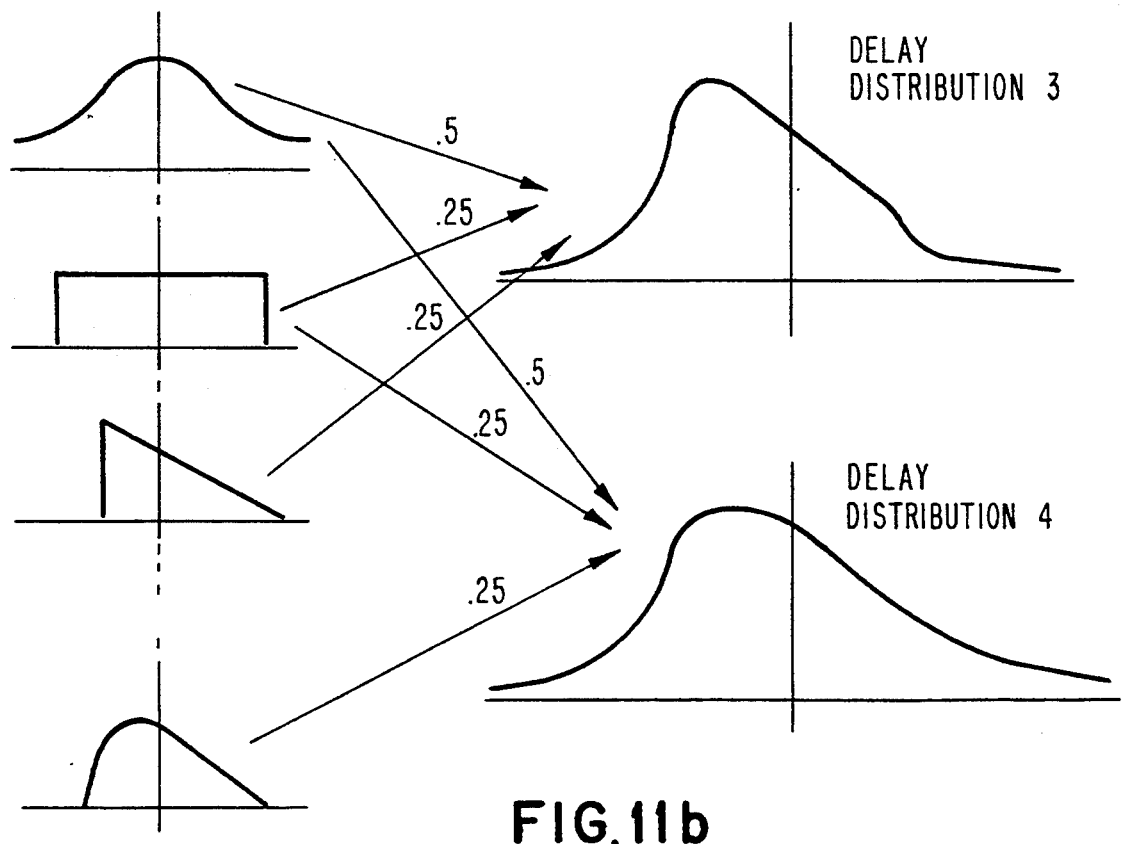

As shown in FIG. 11a, a number of independent, uncorrelated Gaussian distributions, each having a mean of 0 and a standard deviation, $\sigma$, of 1, are combined in weighted sums to produce two delay distributions which are correlated with each other. The weighting numbers, indicated adjacent the arrows in the Figure, are entries in the transform matrices, described below, which are derived from the correlation matrices. Producing this weighted sum is a computationally inexpensive operation. The correlation between delay distribution 1 and delay distribution 2 can be expressed by a correlation coefficient. The value of one delay will then indicate a spread of values of the other delay. Further, as shown in FIG. 11b, the independent, uncorrelated distributions (specified by the user in the form of tables or sub-routines or the like to establish shapes of distributions) need not be Gaussian but can be of any form so long as they have a mean of 0 and a $\sigma$ of 1. Thus, delay distributions 3 and 4, for instance, can be built up having variable skew, kurtosis, etc. and can become arbitrarily close to measured real world delay distributions, as shown. By precomputing many number from these distributions and randomly selecting from these precomputed numbers at run-time, random numbers with arbitrary desired distributions can be inexpensively generated. As in FIG. 11a, the correlation resulting from these distributions can be matched to the correlation coefficients.

The ability to accommodate asymmetric distributions has two advantages over prior art Monte Carlo techniques. First, some asymmetries in delay distributions result from the production methods used to produce devices according to the design and it is necessary to take such empirical data into account if modelling is to be accurate. This delay asymmetry can be handled by the techniques described above. Second, some asymmetry in the arrival time distribution is produced internally by the prior art Monte Carlo technique. The prior art Monte Carlo technique picks the worst case arrival times at each node independently for each simulated machine. As a result, the arrival time distribution at a node is more pessimistic than any of the input distributions. The actual probability distribution of the arrival times, according to the invention, is skewed towards later times which is a more accurate representation of the distribution than picking the worse of two input distributions. Third, reporting of a worst case arrival time at the 99.87% confidence point (the $3\sigma$ point), it is intended that any asymmetry in arrival time be taken into account. Since the present invention can model the arrival time with a function which is more general than any fixed shape distribution function, such as a symmetrical Gaussian distribution, the estimate of the 99.87% confidence point can be more accurately made. For example, referring to FIG. 11c, Curve A represents a typical skewed arrival time distribution which might be observed in actual tests of the design or produced by the prior art Monte Carlo technique if a sufficiently accurate delay model and otherwise good modelling practices are observed. If this curve is approximated by a symmetrical Gaussian distribution, as shown by curve B, for purposes of reporting likelihood of failure at a particular node, as in the prior art, the estimate of the worst case arrival time (with 99.87% confidence) is indicated by the $3\sigma_B$ point, which is well short of the true value which actually lies at the point indicated by vertical line A'. The present invention can model the arrival time with a more general function, such as curve C, than a Gaussian or other fixed shape distribution curve, allowing a closer fit to the actual arrival time distribution and a better estimate, indicated by vertical line C', of the 99.87% confidence point in the distribution. The new estimate in the distribution shown by curve C is therefore much closer to the true value than in the approximations allowed by the prior art.

In practice, according to the invention, delay distributions are built up in this way for all technologies involved in the design of the digital machine to be simulated. The distributions are built up to mimic the distributions of measurements made previously on other designs using those technologies or may be extrapolated from other data. The correlation between pairs of these distributions are then computed and expressed as correlation coefficients which are then stored and retrieved for use during digital machine simulation.

More specifically, in the preferred embodiment of the invention, the matrix of correlation coefficients is used to derive three transformation matrices, prior to design simulation, which are then used to scale random numbers. The scaled random numbers are then added to produce a sum which is used as a multiplier for $\sigma$, the variation from a nominal value of the delay. While the computation of the transform matrices is complex, the values of the transform matrices are fixed, during simulation processing and dependent on the values in the correlation matrix. Therefore, the assembly of the distributions, the development of the correlation coefficient matrix and the computation of the transform matrices must be done only once for a given combination of technologies involved in a design. The particular process of deriving these values is detailed in Appendix A, attached hereto, but is not necessary to an understanding of the invention. It is to be understood that the particular computations contained in Appendix A are exemplary and the invention is not limited to this particular computation method for the simple reason that, once calculated, the transformation matrix values are fixed and the invention can be advantageously used with any set of fixed numbers which accurately reflect real world values of statistical variation of the delays in the technology or combination of technologies adopted in the design.

To summarize Appendix A, insofar as the actual simulation of a digital machine is concerned, a scale value, scale$_i$ is computed according to the formula $$scale_i = \bar{\bar{A}}\,\overline{rnd}_g + \bar{\bar{B}}\,\overline{rnd}_c + \bar{\bar{C}}\,\overline{rnd}_s$$

(Appendix A, equation (5.0)) where $\bar{\bar{A}}, \bar{\bar{B}}$ are transform matrices from the raw, uncorrelated random variables to the off chip and on chip parts of the scale random variables, $\bar{\bar{C}}$ is the matrix which scales the random variable which is unique to a particular delay, $\overline{rnd}_g$ is the chip random variable vector, responsible for off chip correlation, $\overline{rnd}_c$ is the chip random variable vector, responsible for on chip correlation, and $\overline{rnd}_s$ is the segment random variable vector, responsible for uncorrelated parts of the delay. The computed value for scale$_i$ is then used to compute the delay according to the formula $$D_i = nom_i + \sigma\, scale_i$$

(Appendix A, equation (2.0)) where nom$_i$ is the nominal value of the delay of the i-th segment and will be constant for the corresponding segment of all simulated machines. Once the delay is computed, AT$_i$, RAT$_i$ and Slack$_i$ can be easily and quickly computed for each segment by propagating the delay through the design as discussed above.

Having thus described the operation of a preferred embodiment of the invention, several important features of the invention will now be considered. Suppose that an engineer wishes to display the set of delay values which led to a particular timing problem such as a bad slack on a particular segment. Since the seed used for generating each random machine is retained, the results of the analysis can be examined in, for instance, the data structure of FIG. 8, by comparing corresponding segments of each simulated machine to find the simulated machine in which the slack was worst. Then, since the same set of random numbers will always be generated by the random number generator from the same seed value, all of the values for that machine can be regenerated and a more detailed analysis can be performed to determine why the worst slack for that segment of the design occurred in that machine. The probability of the particular delay values can also be evaluated and a determination made as to whether a significant design defect exists. For instance, for segment CD in FIG. 6, which receives two signals, if the signal arriving through segments AB and BC must be delayed by a large amount which has, say, a 1% probability in each segment and the signal arriving through segments GH and HC must be delayed by a small amount which has a similar small probability of occurrence, correction of the design to eliminate a defect which would only occur in an extremely small percentage of the devices produced may not be justified.

Figure 6:
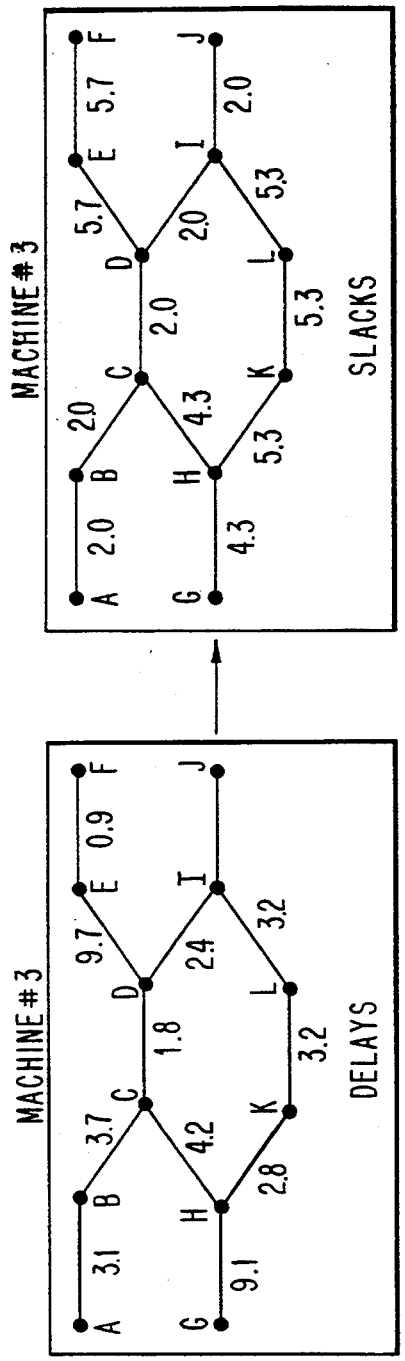

Another advantage of the present invention is the capacity for reporting data which is useful in establishing specifications and projecting manufacturing yields. After simulation according to the invention which maps delays to slacks, as shown in FIG. 6, each simulated machine will represent a network of slacks. Each machine will have a worst slack which can be determined from the data structure illustrated in FIG. 7b. The worst slack may vary from segment to segment in individual simulated machines and the critical path containing that worst slack may also vary. By looking at the worst slack of all machines simulated, a statistical distribution of worst slack can be projected. Since the shortest cycle time at which a particular machine will be operative will be governed by the worst slack in the machine, the distribution of worst slacks will also represent the distribution of shortest operable cycle times. Such reporting of worst slacks therefore directly represents the tradeoff between cycle times and manufacturing yield. Specifications can then be established for the design which will allow an acceptable manufacturing yield to be obtained. Similarly, this data will indicate what percentage of a manufacturing run can be expected to operate at a given cycle time and what percentage would be marketable at a derated cycle time.

Reporting of the worst slack distribution over a number of simulated machines can also be used to assess the relative severity of bad segment slacks since similar bad slacks appearing on different segments will be likely to skew the worst slack distribution and indicate the need to correct a number of the segments which produce such bad slacks even if the probability of such a bad slack on a given segment is small.

Figure 12A:
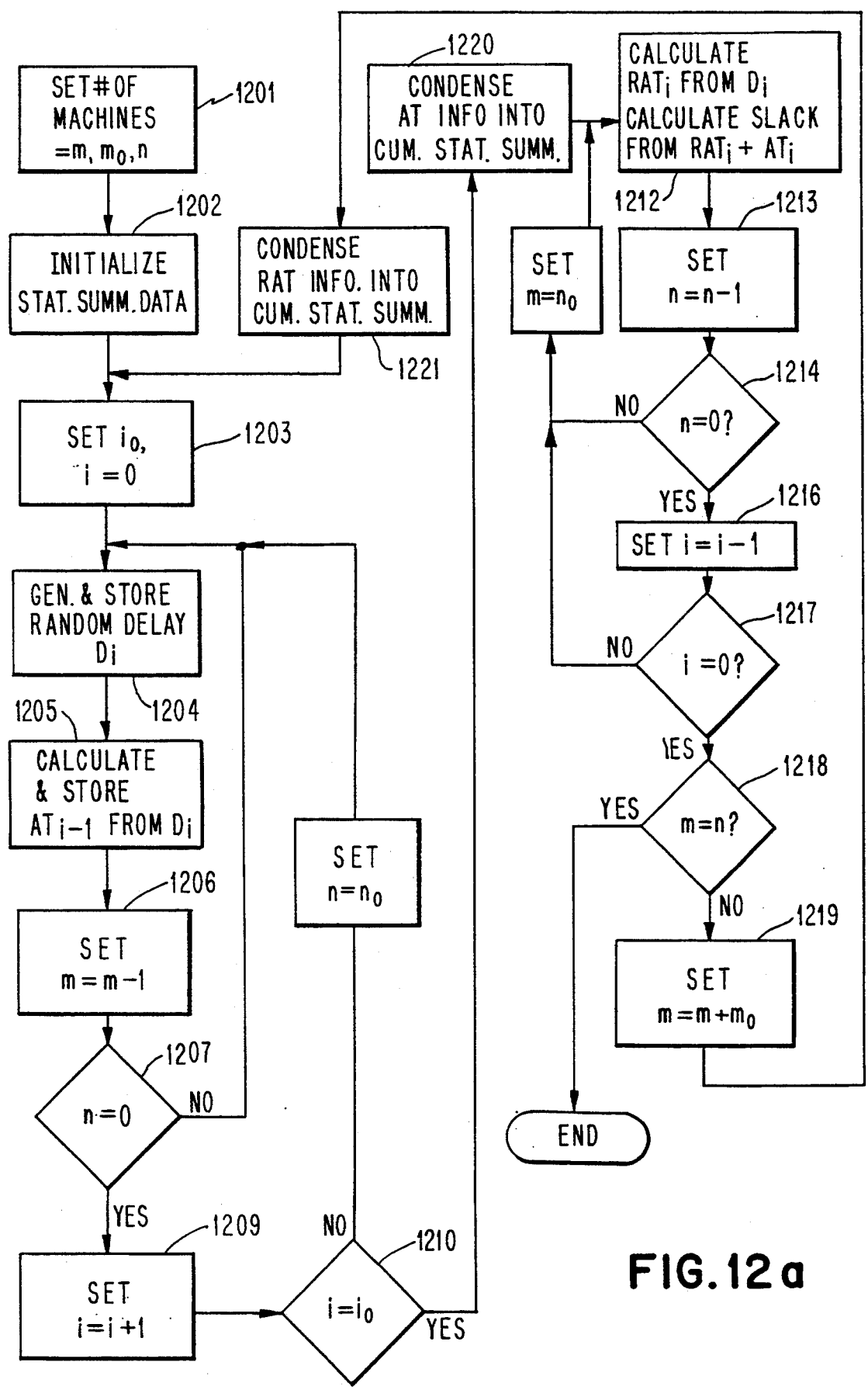
FIG. 12a is a flow chart illustrating a further computational enhancement according to the invention.

An additional computational enhancement according to the invention will now be described with reference to FIGS. 12a and 12b. For simulating machines with a very large number of nodes and where it is desired to generate a large number of samples, dynamic memory capacity may be exceeded following the procedure according to the invention as illustrated in FIG. 7a. According to another aspect of the invention, the number of simulated machines is broken up into subsets which can be accommodated by available memory. In this case, the data structure is modified as shown in FIG. 12b to include all the data shown in FIG. 7a for each machine in the subset with an additional statistical summary, including the subsets needed to do the complete simulation, which are retained throughout the complete run.

The process for using the statistical summary information is to maintain a summary for all the subsets which have been processed up to a given point in the simulation, updating it after each subset to incorporation the information from that subset. After all subsets have been processed, the worst case values of the data being summarized can be estimated from the statistical summary. For instance, if the statistical summaries contain the number of each of the data items, the mean of the data items and the $\sigma$ of the data items, then a simple estimate of the worst case arrival time would be the mean plus $3\sigma$.

The crucial point about the statistical summaries is that they occupy far less storage than the subsets they summarize. If, for example, an analysis of 1000 simulated machines were performed by processing subsets of 100 simulated machines, during the processing of the last subset, the statistical summaries of the previous 900 machines would occupy the memory space of only 3 numbers rather than 900. More complex statistical summaries can also be used to retain more information about the previously processed subsets while still maintaining reasonable bounds on the volume of data retained. For instance, it may be useful to also retain third and fourth order moments of the distribution in addition to the mean and $\sigma$. Alternatively, a set of parameters for a model of the data distributions (e.g. a sum of Gaussian distributions) updating this set of parameters after each subset.

The process is very similar to that of FIG. 7a and the computation steps 1204, 1205, 1212 are identical to steps 704, 705 and 712, respectively. similarly initializing, incrementing, decrementing and branching steps 1201, 1203, 1206, 1207, 1209, 1210, 1213, 1214, 1215, 1216 and 1217 are like the corresponding steps in FIG. 7a. The process of FIG. 12a differs from that of FIG. 7a by the inclusion of initializing step 1202 to initialize the statistical summary data, the inclusion of the number of simulated machines, m, to be included in each sub-run and a loop from the end of one sub-run to the beginning of the next. Additional computing steps of condensing data into cumulative statistical summaries is done at the end of each forward and backward propagation through the design for a given subset of simulated machines.

From the above, it is seen that the invention provides numerous computational, diagnostic and reporting enhancements while improving accuracy and increasing generality of applicability. The accuracy and repeatability provided by the invention allows detailed analysis of particular failure modes and represents a valuable design tool for the digital machine engineer. The accuracy of the simulations provided allow quantitative assessment of the importance of any timing faults discovered and allows the setting of specifications for designs and the projection of manufacturing yields.

While the invention has been described in terms of a single preferred embodiment, those skilled in the art will recognize that the invention can be practiced with modification within the spirit and scope of the appended claims.

APPENDIX "A"

1.1.1 Requirements in Terms of Delays

In the description below, delays have been treated as random variables drawn from an infinite ensemble, with the understanding that all averages are averages over that ensemble. One can equally well treat them as part of a large sample vector, with the averages understood as the limit where the number of samples becomes infinite. If the reader prefers the second interpretation, they should add a dimension to each of the random vectors shown, in order to account for the sample index.

Terms used in delay requirements.

| | |
|---|---|
| $i, j$ | Indices for segments (or, more precisely, the rising and falling delays of segments) in the timing model |
| $dly_i$ | The i-th delay (in the (i/2)-th segment) in the model. |
| $nom_i$ | The nominal (average) component of the i-th delay. |
| $\sigma_i$ | The standard deviation of the i-th delay. |
| rftech($i$) | For the i-th delay in the model, the combination of the technology of the (i/2)-th segment, and whether the i-th delay is a rising or falling delay. |
| chip($i$) | The identity of the chip that the i-th delay is from. |
| $\rho_{\text{on-chip } rftech1, rftech2}$ | The correlation between two delays, one of type rftech1 and the other of rftech2, on the same chip. |
| $\rho_{\text{off-chip } rftech1, rftech2}$ | The correlation between two delays, one of type rftech1 and the other of rftech2, on different chips. |

The nominals must be right:

$$\overline{dly_i} = nom_i \qquad [1.0]$$

The sigmas must be right:

$$\sqrt{\overline{(dly_i - nom_i)^2}} = \sigma_i \qquad [1.1]$$

The on-chip correlations must be right. If $i \neq j$ but chip($i$) = chip($j$) then $$\rho_{dly_i, dly_j} = \rho_{\text{on-chip } rftech(i), rftech(j)} \qquad [1.2]$$

The off-chip correlations must be right If $i \neq j$ but chip($i$) $\neq$ chip($j$) then $$\rho_{dly_i, dly_j} = \rho_{\text{off-chip } rftech(i), rftech(j)} \qquad [1.3]$$

1.1.2 Model for delays using "scale"

$$dly_i = nom_i + \sigma_i \, scale_i \qquad [2.0]$$

1.1.3 Expansion of delay conditions in terms of scales

Correct nominals:

$$\overline{dly_i} = \overline{nom_i + \sigma_i \, scale_i} = nom_i + \sigma_i \overline{scale_i} \qquad [3.0]$$

So constraining $\overline{dly_i}$ to be $nom_i$ constrains $\overline{scale_i}$ to be zero.

$$\sqrt{\overline{(dly_i - nom_i)^2}} = \sqrt{\overline{(nom_i + \sigma_i \, scale_i - nom_i)^2}} = \sqrt{\overline{(\sigma_i \, scale_i)^2}} = \sigma_i \sqrt{\overline{scale_i^2}} \qquad [3.1]$$

So constraining $\sqrt{\overline{(dly_i - nom_i)^2}}$ to be $\sigma_i$ constrains the variance of $scale_i$ to one.

$$\rho_{dly_i, dly_j} = \frac{\overline{(dly_i - \overline{dly_i})(dly_j - \overline{dly_j})}}{\sqrt{\overline{(dly_i - \overline{dly_i})^2}} \sqrt{\overline{(dly_j - \overline{dly_j})^2}}} = \frac{\overline{(scale_i \, \sigma_i)(scale_j \, \sigma_j)}}{\sqrt{\overline{(scale_i \, \sigma_i)^2}} \sqrt{\overline{(scale_j \, \sigma_j)^2}}} = \overline{scale_i \, scale_j} \qquad [3.2]$$

so the requirements on the delay correlations apply to the scale covariances.

1.1.4 Requirements in Terms of Scales

Zero mean:

$$\overline{scale_i} = 0 \qquad [4.0]$$

Unit variance:

$$\overline{scale_i^2} = 1 \qquad [4.1]$$

Correct on-chip covariance: If $i \neq j$ but $chip(i) = chip(j)$ then $$\overline{scale_i \, scale_j} = \rho_{\text{on-chip rftech}(i) \, \text{rftech}(j)} \qquad [4.2]$$

Correct off-chip covariance: If $i \neq j$ and $chip(i) \neq chip(j)$ then $$\overline{scale_i \, scale_j} = \rho_{\text{off-chip rftech}(i) \, \text{rftech}(j)} \qquad [4.3]$$

1.1.5 Model for Scale Using Transform Matrices

Terms used in Scale Model

$\overline{\overline{A}}, \overline{\overline{B}}$      Transform matrices from the raw, uncorrelated random variables (gaussians in the current implementation) to the off-chip and on-chip parts of the correlated scale random variables.

$\overline{\overline{C}}$      Matrix which scales the random variable which is unique to a particular delay $\vec{rnd}_g$      Global random variable vector, responsible for off-chip correlation.

$\vec{rnd}_c$      Chip random variable vector, responsible for on-chip correlation.

$\vec{rnd}_s$      Segment random variable vector, responsible for uncorrelated part of delays.

Each of the components of each of the random vectors comes from a separate sampling of a zero mean, unit variance random variable. All of the components are fully independent and therefore uncorrelated.

$$scale_i = (\overline{\overline{A}} \vec{rnd}_g + \overline{\overline{B}} \vec{rnd}_{c \, chip(i)} + \overline{\overline{C}} \vec{rnd}_{s \, i})_{\text{rftech}(i)} \qquad [5.0]$$

$$\overline{\vec{rnd}_g} = \overline{\vec{rnd}_c} = \overline{\vec{rnd}_s} = 0 \qquad [5.1]$$

$$\overline{\vec{rnd}_{g \, component}^2} = \overline{\vec{rnd}_{c \, component}^2} = \overline{\vec{rnd}_{s \, component}^2} = 1 \qquad [5.2]$$

$$\overline{\vec{rnd}_{g \, component} \, \vec{rnd}_{c \, component}} = \overline{\vec{rnd}_{c \, component} \, \vec{rnd}_{s \, component}} = \overline{\vec{rnd}_{s \, component} \, \vec{rnd}_{g \, component}} = 0 \qquad [5.3]$$

For $component \neq component'$ $$\overline{\vec{rnd}_{g \, component} \, \vec{rnd}_{g \, component'}} = \overline{\vec{rnd}_{c \, component} \, \vec{rnd}_{c \, component'}} = \overline{\vec{rnd}_{s \, component} \, \vec{rnd}_{s \, component'}} = 0 \qquad [5.4]$$

For $chip \neq chip'$ and $i \neq j$ $$\overline{\vec{rnd}_{c \, component \, chip} \, \vec{rnd}_{c \, component' \, chip'}} = \overline{\vec{rnd}_{s \, component \, i} \, \vec{rnd}_{s \, component' \, j}} = 0 \qquad [5.5]$$

1.1.6 Expansion of Scale Conditions in Terms of Transform Matrices $$\overline{scale_i\, scale_j} = \overline{(\bar{\bar{A}}\vec{rnd}_g + \bar{\bar{B}}\vec{rnd}_{c\ \text{chip}(i)} + \bar{\bar{C}}\vec{rnd}_{s\ i})_{\text{rftech}(i)} (\bar{\bar{A}}\vec{rnd}_g + \bar{\bar{B}}\vec{rnd}_{c\ \text{chip}(j)} + \bar{\bar{C}}\vec{rnd}_{s\ j})_{\text{rftech}(j)}} \qquad [6.0]$$

These terms can be expanded, eg:

$$(\bar{\bar{A}}\vec{rnd}_g)_{\text{rftech}(i)} = \sum_{k=1}^{\text{max\_rftechs}} A_{\text{rftech}(i)\ k}\, rnd_{g\ k} \qquad [6.1]$$

When 6.0 is fully expanded, all of the cross-terms between different *types* of random components vanish (see 5.3) leaving only:

$$\overline{scale_i\, scale_j} = \text{term}_A + \text{term}_B + \text{term}_C \qquad [6.2]$$

where $$\text{term}_A = \overline{\left(\sum_{k=1}^{\text{max\_rftechs}} A_{\text{rftech}(i)\ k}\, rnd_{g\ k}\right)\left(\sum_{l=1}^{\text{max\_rftechs}} A_{\text{rftech}(j)\ l}\, rnd_{g\ l}\right)} \qquad [6.3]$$

$$\text{term}_B = \overline{\left(\sum_{k=1}^{\text{max\_rftechs}} B_{\text{rftech}(i)\ k}\, rnd_{c\ k\ \text{chip}(i)}\right)\left(\sum_{l=1}^{\text{max\_rftechs}} B_{\text{rftech}(j)\ l}\, rnd_{c\ l\ \text{chip}(j)}\right)} \qquad [6.4]$$

$$\text{term}_C = \overline{\left(\sum_{k=1}^{\text{max\_rftechs}} C_{\text{rftech}(i)\ k}\, rnd_{c\ k\ i}\right)\left(\sum_{l=1}^{\text{max\_rftechs}} C_{\text{rftech}(j)\ l}\, rnd_{c\ l\ j}\right)} \qquad [6.5]$$

The $\text{term}_A$ can be multiplied out to give $$\text{term}_A = \overline{\sum_{k=1}^{\text{max\_rftechs}} \sum_{l=1}^{\text{max\_rftechs}} A_{\text{rftech}(i)\ k}\, rnd_{g\ k}\, A_{\text{rftech}(j)\ l}\, rnd_{g\ l}} =$$

$$\sum_{k=1}^{\text{max\_rftechs}} \sum_{l=1}^{\text{max\_rftechs}} A_{\text{rftech}(i)\ k}\, A_{\text{rftech}(j)\ l}\, \overline{rnd_{g\ k}\, rnd_{g\ l}} =$$

$$\sum_{k=1}^{\text{max\_rftechs}} \sum_{l=1}^{\text{max\_rftechs}} A_{\text{rftech}(i)\ k}\, A_{\text{rftech}(j)\ l}\, \delta_{k\ l} =$$

$$\sum_{k=1}^{\text{max\_rftechs}} A_{\text{rftech}(i)\ k}\, A_{\text{rftech}(j)\ k} = \sum_{k=1}^{\text{max\_rftechs}} A_{\text{rftech}(i)\ k}\, A^t_{k\ \text{rftech}(j)} = (\bar{\bar{A}}\,\bar{\bar{A}}^t)_{\text{rftech}(i)\ \text{rftech}(j)} \qquad [6.6]$$

Similar arguments apply to the other two terms, giving $$\text{term}_B = \delta_{\text{chip}(i)\ \text{chip}(j)} (\bar{\bar{B}}\,\bar{\bar{B}}^t)_{\text{rftech}(i)\ \text{rftech}(j)} \qquad [6.7]$$

$$\text{term}_C = \delta_{ij} (\bar{\bar{C}}\,\bar{\bar{C}}^t)_{\text{rftech}(i)\ \text{rftech}(j)} = \delta_{ij} (\bar{\bar{C}}\,\bar{\bar{C}}^t)_{\text{rftech}(i)\ \text{rftech}(i)} \qquad [6.8]$$

So the overall expression for $\overline{scale_i\, scale_j}$ is $$(\bar{\bar{A}}\,\bar{\bar{A}}^t)_{\text{rftech}(i)\ \text{rftech}(j)} + \delta_{\text{chip}(i)\ \text{chip}(j)}(\bar{\bar{B}}\,\bar{\bar{B}}^t)_{\text{rftech}(i)\ \text{rftech}(j)} + \delta_{ij}(\bar{\bar{C}}\,\bar{\bar{C}}^t)_{\text{rftech}(i)\ \text{rftech}(i)} \qquad [6.9]$$

In expressing conditions (4.2) and (4.3) the last term vanishes and we get conditions on the $\bar{\bar{A}}$ and $\bar{\bar{B}}$ transformation matrices. Condition (4.4) reduces to $(\overline{\overline{C}}\,\overline{\overline{C}}^t)_{\text{rftech}(i)\ \text{rftech}(j)} = 1 - \rho_{\text{on-chip rftech}(i)\ \text{rftech}(j)}$ [6.10]

which can be satified by, for instance, $(\overline{\overline{C}})_{kl} = \delta_{kl}\sqrt{1 - \rho_{\text{on-chip}\,kl}}$ [6.11]

The zero mean condition, (4.0), is satisfied because the *scale*$_i$ are linear combinations of zero mean random vectors, by (5.0) and (5.1).

1.1.7 Transform Matrix Version of the Requirements $\overline{\overline{A}}\,\overline{\overline{A}}^t = \rho_{\text{off-chip}}$ [7.0]

$\overline{\overline{A}}\,\overline{\overline{A}}^t + \overline{\overline{B}}\,\overline{\overline{B}}^t = \rho_{\text{on-chip}}$ $\overline{\overline{B}}\,\overline{\overline{B}}^t = \rho_{\text{on-chip}} - \rho_{\text{off-chip}}$ [7.1]

Both of the transform matrices satisfy an equation of the form $\overline{\overline{T}}\,\overline{\overline{T}}^t = \overline{\overline{\text{sym}}}$ where $\overline{\overline{\text{sym}}}$ is a real, symmetric, positive definite matrix. As a result, $\overline{\overline{\text{sym}}}$ can be broken down into an orthonormal eigenvector matrix and an eigenvalue matrix.

$\overline{\overline{\text{sym}}} = \overline{\overline{\text{orth}}}\,\overline{\overline{\Lambda}}\,\overline{\overline{\text{orth}}}^t$ [7.2]

We can define a square root of the (positive definite) eigenvalue matrix $\sqrt{\overline{\overline{\Lambda}}}_{kl} = \sqrt{\overline{\overline{\Lambda}}_{kl}}$ [7.3]

In which case we find that the equation for $\overline{\overline{T}}$ can be solved by $\overline{\overline{T}} = \overline{\overline{\text{orth}}}\sqrt{\overline{\overline{\Lambda}}}\,\overline{\overline{\text{orth}}}^t$ $\overline{\overline{T}}\,\overline{\overline{T}}^T = (\overline{\overline{\text{orth}}}\sqrt{\overline{\overline{\Lambda}}}\,\overline{\overline{\text{orth}}}^t)(\overline{\overline{\text{orth}}}\sqrt{\overline{\overline{\Lambda}}}\,\overline{\overline{\text{orth}}}^t)^t =$ $(\overline{\overline{\text{orth}}}\sqrt{\overline{\overline{\Lambda}}}\,\overline{\overline{\text{orth}}}^t)(\overline{\overline{\text{orth}}}^{tt}\sqrt{\overline{\overline{\Lambda}}^t}\,\overline{\overline{\text{orth}}}^t) =$ $\overline{\overline{\text{orth}}}\sqrt{\overline{\overline{\Lambda}}}\,\overline{\overline{\text{orth}}}^t\overline{\overline{\text{orth}}}^{tt}\sqrt{\overline{\overline{\Lambda}^t}}\,\overline{\overline{\text{orth}}}^t =$ [7.4]

$\overline{\overline{\text{orth}}}\sqrt{\overline{\overline{\Lambda}}}\,\overline{\overline{\text{orth}}}^t\overline{\overline{\text{orth}}}\sqrt{\overline{\overline{\Lambda}}}\,\overline{\overline{\text{orth}}}^t =$ $\overline{\overline{\text{orth}}}\sqrt{\overline{\overline{\Lambda}}}\sqrt{\overline{\overline{\Lambda}}}\,\overline{\overline{\text{orth}}}^t =$ $\overline{\overline{\text{orth}}}\,\overline{\overline{\Lambda}}\,\overline{\overline{\text{orth}}}^t = \overline{\overline{\text{sym}}}$ The Jacobi algorithm for finding eigenvalues and eigenvectors of a real, symmetric matrix starts with the original matrix and gradually turns it into the eigenvalue matrix by forcing off-diagonal elements to zero. At any given stage $\overline{\overline{\text{sym}}} = \text{orth}\,\Lambda_{\text{approx}}\,\text{orth}^t$. The algorithm consists of 1. Initializing $\overline{\overline{\text{orth}}} = \overline{\overline{\text{identity}}}$. Initializing $\overline{\overline{\Lambda_{\text{approx}}}} = \overline{\overline{\text{sym}}}$.

2. Examining the current $\overline{\overline{\Lambda_{\text{approx}}}}$, selecting an off-diagonal element (in this implementation, the maximum one) in it, and generating an orthogonal step (OS) matrix from this that forces the off-diagonal element to zero.

3. Using OS to update the current estimates of the eigenvector and eigenvalue matrices: $\overline{\overline{\text{orth}'}} = \overline{\overline{\text{orth}}}\,\overline{\overline{\text{OS}}}$
   $\Lambda_{\text{approx}}' = \overline{\overline{\text{OS}}}^t\Lambda_{\text{approx}}\,\overline{\overline{\text{OS}}}$ 4. Testing $\overline{\overline{\Lambda_{\text{approx}}}}$ to see if there is a sufficient amount of off-diagonal stuff left to justify going back to step 2.

```
Template for orthogonal matrix for a step: orth-step, OS:
|cos -sin|   |cos -sin| * | cos sin| = | 1 0 |
|sin  cos|   |sin  cos|   |-sin cos|   | 0 1 |
more precisely, OS looks like:
| 1 0 0 0 0 0 0|
| 0 1 0 0 0 0 0|
```

```
| 0 0 X 0 0 -Y 0|
| 0 0 0 1 0 0 0|
| 0 0 0 0 1 0 0|
| 0 0 Y 0 0 X 0|
| 0 0 0 0 0 0 1|
```
where
X2+Y2=1 for the elements that we are trying to remove from the off-diagonal positions:

$$\begin{vmatrix} A' & B' \\ B' & C' \end{vmatrix} = \begin{vmatrix} X & Y \\ -Y & X \end{vmatrix} * \begin{vmatrix} A & B \\ B & C \end{vmatrix} * \begin{vmatrix} X & -Y \\ Y & X \end{vmatrix}$$

$$\begin{vmatrix} A & B \\ B & C \end{vmatrix} \quad \begin{vmatrix} X & -Y \\ Y & X \end{vmatrix}$$

$$\begin{vmatrix} X & Y \\ -Y & X \end{vmatrix} \quad \begin{vmatrix} XA+YB & XB+YC \\ -YA+XB & -YB+XC \end{vmatrix} \quad \begin{vmatrix} XAX+YBX+XBY+YCY & -XAY-YBY+XBX+YCX \\ -YAX+XBX-YBY+XCY & YAY-XBY-YBX+XCX \end{vmatrix}$$

$$\begin{vmatrix} A' & B' \\ B' & C' \end{vmatrix} = \begin{vmatrix} XAX+YBX+XBY+YCY & -XAY-YBY+XBX+YCX \\ -YAX+XBX-YBY+XCY & YAY-XBY-YBX+XCX \end{vmatrix}$$

$$= \begin{vmatrix} AXX+2BXY+CYY & (C-A)XY+B(XX-YY) \\ (C-A)XY+B(XX-YY) & AYY-2BXY+CXX \end{vmatrix}$$

We want B' to be zero, so we should pick y so that
(note: picking a matrix of |cos sin| as the initial template gives the
same final condition on B')|sin -cos|

$$(c-a)xy + b(x^2 - y^2) = 0 \qquad [8.0]$$

$$(a-c)xy = b(x^2 - y^2) \qquad [8.1]$$

$$d \equiv \frac{b}{a-c} \qquad [8.2]$$

$$xy = d(x^2 - y^2) = d(x^2 - (1-x^2)) = d(2x^2 - 1) \qquad [8.3]$$

squaring and temporarily losing sign information $$\begin{aligned} x^2 y^2 &= d^2(2x^2-1)^2 \\ x^2(1-x^2) &= d^2(4x^4 - 4x^2 + 1) \\ x^2 - x^4 &= 4d^2 x^4 - 4d^2 x^2 + d^2 \\ 0 &= (4d^2+1)x^4 - (4d^2+1)x^2 + d^2 \end{aligned} \qquad [8.4]$$

$$e \equiv \frac{d^2}{4d^2+1} \qquad [8.5]$$

$$\begin{aligned} 0 &= x^4 - x^2 + e \\ 0 &= (x^2)^2 - (x^2) + e \\ (x^2) &= \frac{1 \pm \sqrt{1-4e}}{2} \end{aligned} \qquad [8.6]$$

The discriminant, $1 - 4e$ is $$discr = 1 - 4e = 1 - 4\frac{d^2}{4d^2+1} = \frac{4d^2+1-4d^2}{4d^2+1} = \frac{1}{4d^2+1} \qquad [8.7]$$

so it is always positive. Using the formula for the discriminant we have $$(x^2) = \frac{1 \pm \sqrt{discr}}{2} = \frac{1 \pm \sqrt{\frac{1}{4d^2+1}}}{2} \qquad [8.8]$$

Both solutions are legal, and both give $x^2 \in [0, 1]$. Picking $$x^2 = \frac{1 + \frac{1}{\sqrt{4d^2+1}}}{2} = \frac{1}{2} + \frac{1}{\sqrt{16d^2+4}} \qquad x^2 \in [\frac{1}{2}, 1]$$

$$y^2 = \frac{1 - \frac{1}{\sqrt{4d^2+1}}}{2} = \frac{1}{2} - \frac{1}{\sqrt{16d^2+4}} \qquad y^2 \in [0, \frac{1}{2}] \qquad [8.9]$$

has the effect of maximizing x, which minimizes the rearrangement of diagonal elements. To recover the sign information, $$xy = d(x^2 - y^2)$$

$$\text{sgn}(x)\,\text{sgn}(y) = \text{sgn}(d)\,\text{sgn}(x^2 - y^2) \qquad [8.10]$$

Given our choices for $x^2$ and $y^2$, $x^2 > y^2$ is always true, so $\text{sgn}(x^2 - y^2) \equiv 1$. Since we have one free choice of sign, we can always pick $\text{sgn}(x) = 1$  $\text{sgn}(y) = \text{sgn}(d)$. This leaves our final choices for x and y as $$x = +\sqrt{\frac{1}{2} + \frac{1}{\sqrt{16d^2+4}}} \qquad x \in [\frac{1}{\sqrt{2}}, 1]$$

$$y = \text{sgn}(d)\sqrt{\frac{1}{2} - \frac{1}{\sqrt{16d^2+4}}} \qquad y \in [-\frac{1}{\sqrt{2}}, \frac{1}{\sqrt{2}}] \qquad [8.11]$$

The limiting behavior for very large and very small d needs to be handled explicitly in order to get good numerical accuracy.

$d \simeq 0$ $$x = +\sqrt{\frac{1}{2} + \frac{1}{\sqrt{16d^2+4}}} \simeq +\sqrt{\frac{1}{2} + \frac{1}{2(1+2d^2)}} \simeq +\sqrt{\frac{1}{2} + \frac{1}{2}(1-2d^2)} \simeq +\sqrt{1-d^2} \qquad [8.12]$$

$$y = \text{sgn}(d)\sqrt{\frac{1}{2} - \frac{1}{\sqrt{16d^2+4}}} \simeq \text{sgn}(d)\sqrt{\frac{1}{2} - \frac{1}{2}(1-2d^2)} = \text{sgn}(d)\sqrt{d^2} = \text{sgn}(d)|d| = d \qquad [8.13]$$

$d \simeq \pm \infty$ $$\frac{1}{\sqrt{16d^2+4}} \simeq \frac{1}{4|d|} \qquad [8.14]$$

$$x = +\sqrt{\frac{1}{2} + \frac{1}{\sqrt{16d^2+4}}} \simeq +\sqrt{\frac{1}{2} + \frac{1}{4|d|}} \qquad [8.15]$$

$$y = \text{sgn}(d)\sqrt{\frac{1}{2} - \frac{1}{\sqrt{16d^2+4}}} \simeq \text{sgn}(d)\sqrt{\frac{1}{2} - \frac{1}{4|d|}} \qquad [8.16]$$

Having thus described my invention, what I claim as new and desire to secure by Letters Patent is as follows:

1. An apparatus for simulating digital machine performance including:

means for randomly selecting a delay of a particular digital element based upon at least one of a set of correlation factors descriptive of a correlation of delay distributions of said digital element and another digital element, and means for selecting a delay distribution from among at least two differently shaped delay distributions.

2. A method of simulating digital machine performance with an apparatus including means for randomly selecting a delay of a particular digital element based upon at least one of a set of correlation factors descriptive of a correlation of delay distributions of said digital element and another digital element, said method including the steps of applying selected weights to a plurality of selected, normalized, uncorrelated distributions, and deriving at least two delay distributions as weighted sums of respective ones of said uncorrelated distributions.

3. A method as claimed in claim 2, wherein said applying step is responsive to pairs of at least two of pairs of transition state senses, pairs of technologies and pairs of packaging level shared by said digital element and said another digital element.

4. A method as recited in claim 2, wherein at least one of said delay distributions is a differently shaped delay distribution than another of said delay distributions.

5. A method as recited in claim 4, wherein at least one of said differently shaped delay distributions is asymmetrical.

6. A method as recited in claim 2, wherein at least one of said delay distributions is derived as a weighted sum of at least two delay distributions.

7. A method as recited in claim 4, wherein at least one of said differently shaped delay distributions is asymmetrical.

8. A method as recited in claim 4, wherein at least one of said delay distributions is derived as a weighted sum of at least two delay distributions.

9. A method as recited in claim 5, wherein at least one of said delay distributions is derived as a weighted sum of at least two delay distributions.

10. An apparatus for simulating digital machine performance including means for randomly selecting a delay of a particular digital element based upon at least one of a set of correlation factors descriptive of a correlation of delay distributions of said digital element and another digital element, said apparatus including means for storing a seed value corresponding to each of a plurality of simulated digital machines simulated by said apparatus, means for outputting at least said seed value corresponding to any simulated digital machine having a slack of less than a predetermined value.

11. An apparatus as recited in claim 10, further including means for analyzing ones of a plurality of digital machines for slacks of less than a predetermined value.

12. An apparatus as recited in claim 10, further including means for outputting a distribution of slacks of a predetermined number of said simulated digital machines.

13. An apparatus as recited in claim 11, further including means for simulating a particular digital machine with a seed value corresponding to one of said simulated machines having a slack which is less than a predetermined value.

14. An apparatus as recited in claim 13, wherein said slack which is less than a predetermined value is a slack for said simulated machine.

15. An apparatus as recited in claim 13, wherein said slack which is less than a predetermined slack is a slack corresponding to a segment of one of said simulated digital machines.

16. A method of simulating digital machine performance with an apparatus including means for randomly selecting a delay of a particular digital element based upon at least one of a set of correlation factors descriptive of a correlation of delay distributions of said digital element and another digital element, said method including the steps of simulating a plurality of digital machines constituting a subset of said digital machines to derive a predetermined number of results of said simulation of said plurality of digital machines, summarizing said predetermined number of results of said simulation of said plurality of digital machines to produce a plurality of results and simulating a further plurality of said digital machines constituting a further subset of said digital machines, said plurality of results of said summarizing step numbering fewer than said predetermined number.

17. A method for simulating digital machine performance with an apparatus including means for randomly selecting a delay of a particular digital element based upon at least one of a set of correlation factors descriptive of a correlation of delay distributions of said digital element and another digital element, said method including the steps of storing a seed value corresponding to each of a plurality of simulated digital machines simulated by said apparatus, outputting at least said seed value corresponding to any simulated digital machine having a slack of less than a predetermined value.

18. A method as recited in claim 17, further including the step of outputting a distribution of slacks of a predetermined number of said simulated digital machines.

19. A method as recited in claim 17, further including the step of analyzing ones of a plurality of digital machines for slacks of less than a predetermined value.

20. A method as recited in claim 19, further including the step of simulating a particular digital machine with a seed value corresponding to one of said simulated machines having a slack which is less than a predetermined value.

21. A method as recited in claim 20, wherein said slack which is less than a predetermined value is a slack for said simulated machine.

22. A method as recited in claim 20, wherein said slack which is less than a predetermined value is a slack corresponding to a segment of one of said simulated digital machines.

23. An apparatus for simulating digital machine performance including means for randomly selecting a delay of a particular digital element based upon at least one of a set of correlation factors descriptive of a correlation of delay distributions of said digital element and another digital element, means for simulating a plurality of digital machines constituting a subset of said digital machines to derive a predetermined number of results of said simulation of said plurality of digital machines, means for summarizing said predetermined number of results of said simulation of said plurality of digital machines to produce a plurality of results, said plurality of results of said simulation of said plurality of digital machines numbering fewer than said predetermined number and means for simulating a further plurality of digital machines constituting a further subset of said digital machines.

24. An apparatus for simulating digital machine performance including means for randomly selecting a delay of each of a sequence of digital elements of said digital machine based upon at least one of a set of correlation factors descriptive of a correlation of delay distributions of said digital element and another digital element, means for accumulating said delays by traversing a plurality of said sequences of said digital elements.

* * * * *